(12) United States Patent
Bergh et al.

(10) Patent No.: US 7,161,104 B2
(45) Date of Patent: Jan. 9, 2007

(54) TRIP-FREE PCB MOUNTABLE RELAY CONFIGURATION AND METHOD

(75) Inventors: Dallas J. Bergh, Waukesha, WI (US); Steven T. Haensgen, Mukwonago, WI (US); Gary Lehman, New Berlin, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 344 days.

(21) Appl. No.: 10/672,411

(22) Filed: Sep. 26, 2003

(65) Prior Publication Data

US 2005/0067267 A1    Mar. 31, 2005

(51) Int. Cl.
*H01H 9/02* (2006.01)
*H01H 13/04* (2006.01)

(52) U.S. Cl. .......................... 200/305; 200/292; 335/8; 335/127

(58) Field of Classification Search ................ 200/268, 200/281, 284, 289, 292; 335/8–27, 127–132, 335/166, 170, 171–176, 185–202
See application file for complete search history.

(56) References Cited

U.S. PATENT DOCUMENTS

| | | |
|---|---|---|
| 1,839,095 A | 12/1931 | Goetz |
| 2,283,795 A | 5/1942 | Dahl |
| 2,616,010 A | 10/1952 | Scheib, Jr. |
| 3,614,684 A | 10/1971 | Egler |
| 3,655,934 A | 4/1972 | Turnbull |
| 3,728,510 A | 4/1973 | Wallace et al. |
| 3,864,649 A | 2/1975 | Doyle |
| 3,925,742 A | 12/1975 | Muench |
| 3,993,971 A | 11/1976 | Ono et al. |
| 4,087,770 A | 5/1978 | Kuhn et al. |
| 4,097,832 A | 6/1978 | Ritzenthaler et al. |
| 4,181,907 A | 1/1980 | Esposito et al. |
| 4,325,043 A | 4/1982 | Kimpel |
| 4,378,543 A | 3/1983 | Melter et al. |
| 5,179,495 A | 1/1993 | Zuzuly |
| 5,194,839 A | 3/1993 | Tanaka |
| 5,227,750 A | 7/1993 | Connell et al. |
| 5,394,127 A | 2/1995 | Hendel |
| 5,525,948 A | 6/1996 | Poulsen |
| 5,910,759 A | 6/1999 | Passow |
| 5,994,987 A | 11/1999 | Passow |
| 6,020,801 A | 2/2000 | Passow |
| 6,771,154 B1 * | 8/2004 | Funayama et al. .......... 335/159 |
| 2002/0079994 A1 | 6/2002 | Mader et al. |

* cited by examiner

*Primary Examiner*—Richard K. Lee
(74) *Attorney, Agent, or Firm*—Quarles & Brady LLP; Alexander M. Gerasimow

(57) ABSTRACT

A method and assembly for use with a printed circuit board (PCB), the assembly comprising a relay assembly including a relay housing and a trip free reset assembly mounted within the housing and linked to other relay components mounted within the housing for manually resetting the relay after the relay is tripped and at least one pin linked to at least one of the relay components and including a distal end extending from the housing and suitable for direct connection to the PCB.

36 Claims, 17 Drawing Sheets

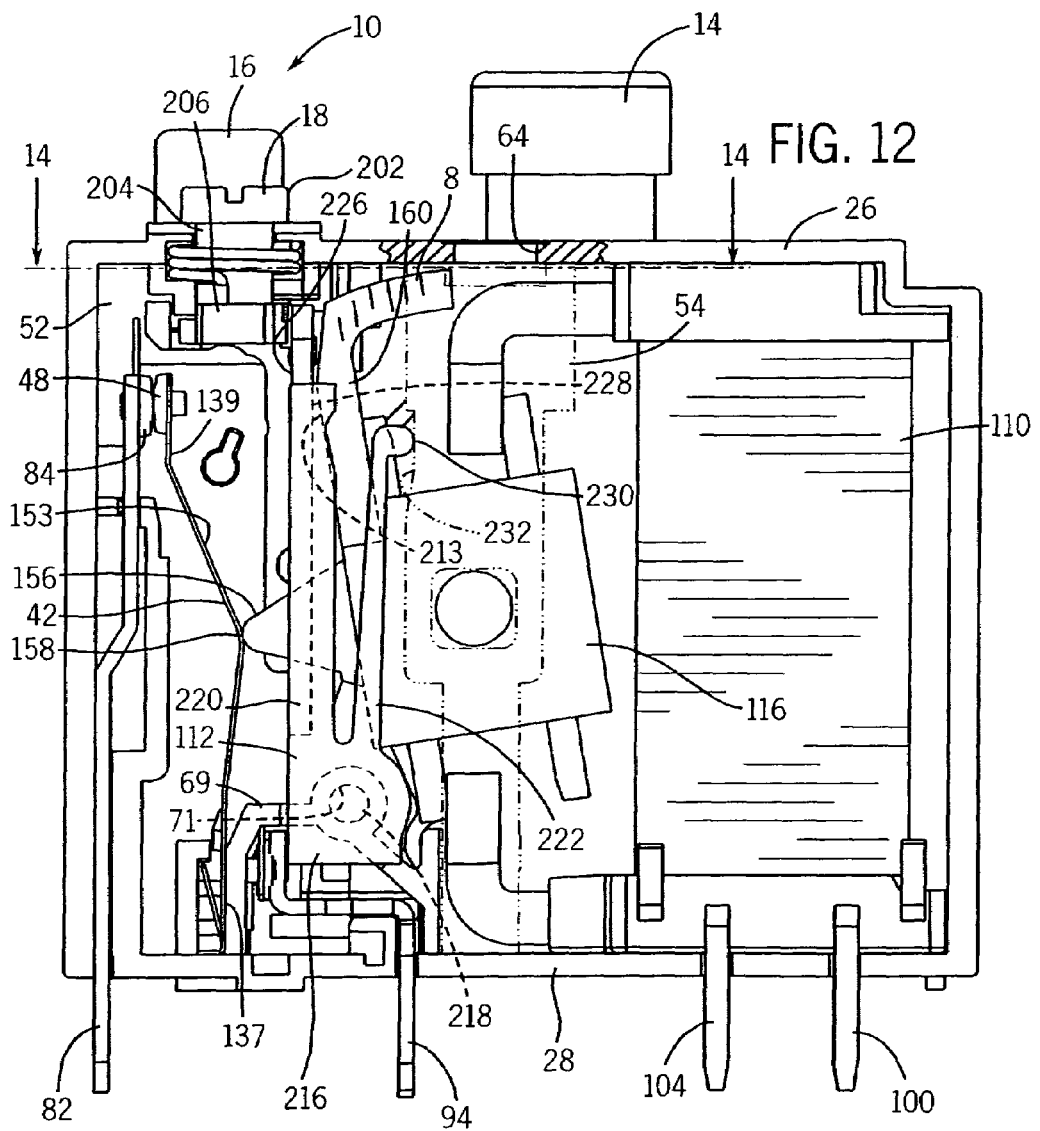
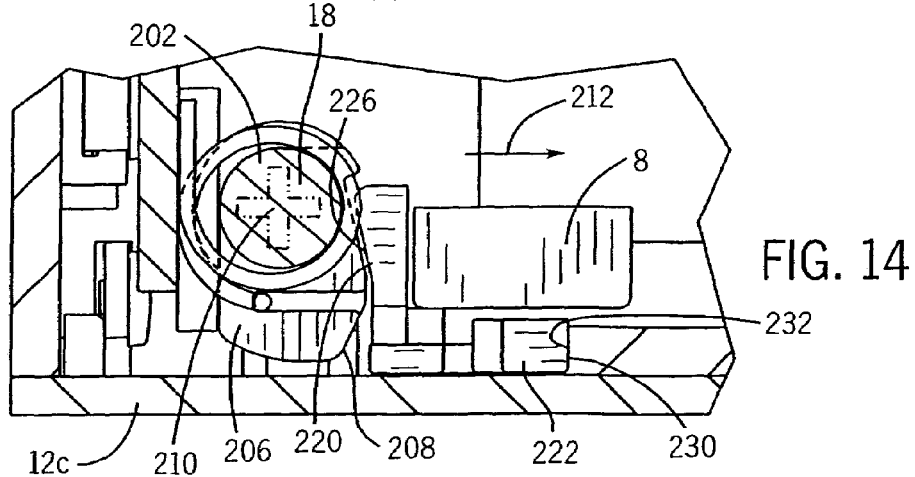

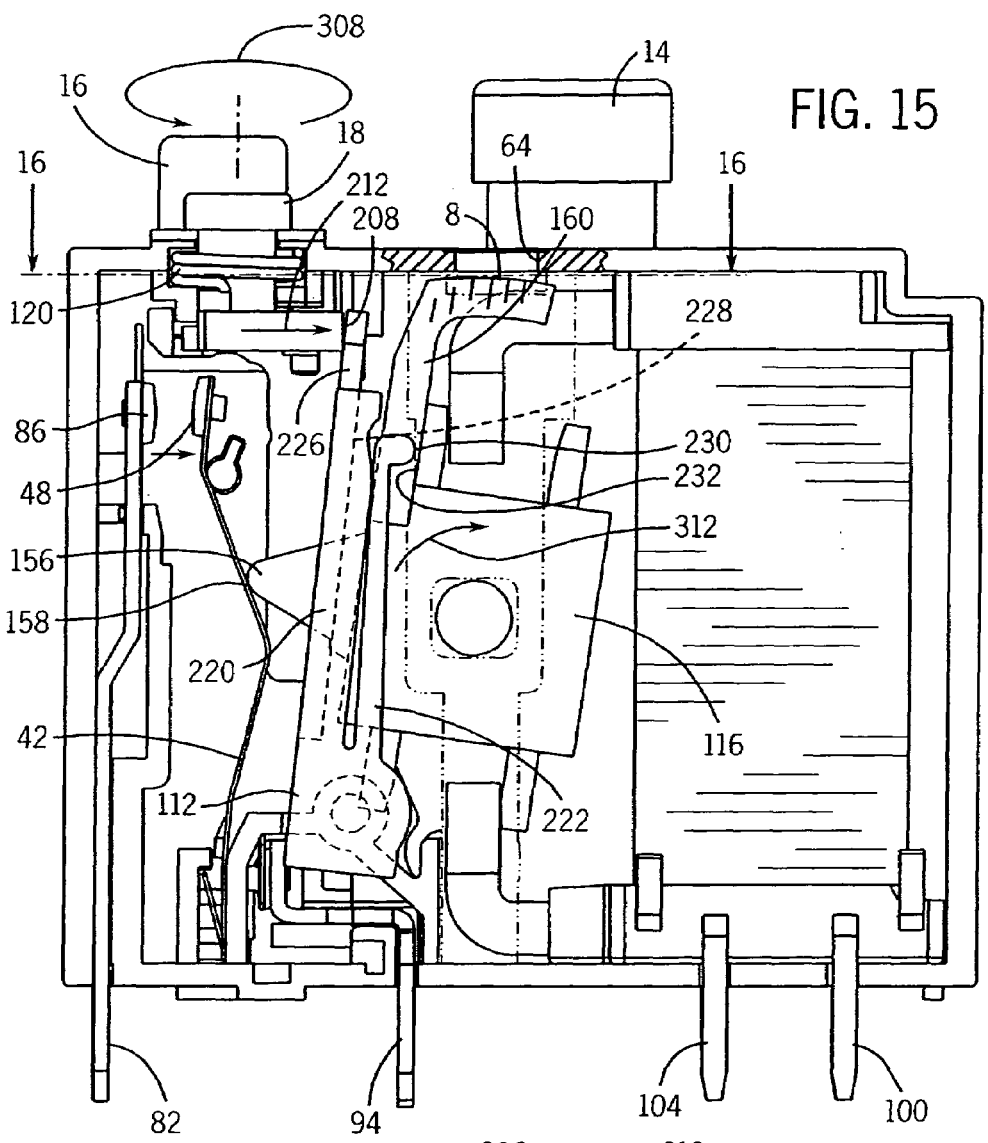
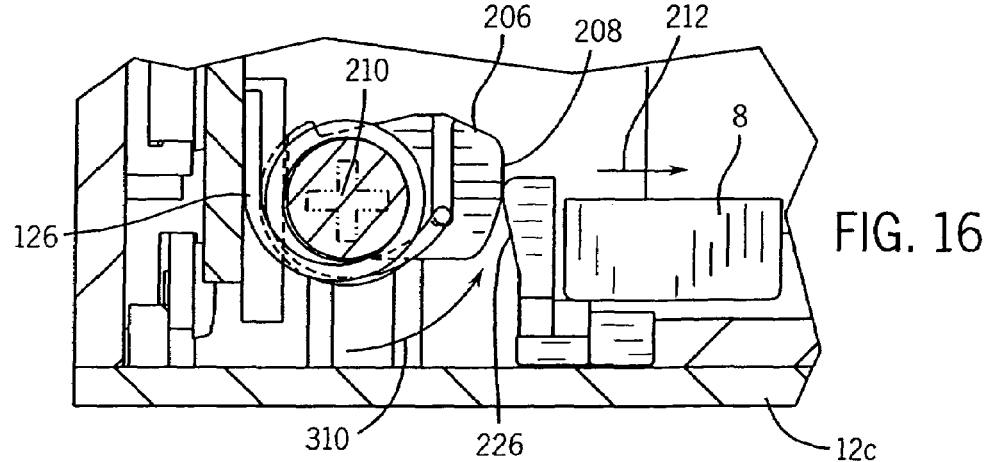

TRIP-FREE PCB MOUNTABLE RELAY CONFIGURATION AND METHOD

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The present invention relates to electrical relays and more specifically to a modular trip free relay suitable for direct connection to a printed circuit board.

Overload relays are electrical switches typically employed in industry to protect equipment from excessive current conditions that in turn cause overheating, performance degradation and eventually equipment malfunction or destruction. For instance, a three phase induction motor is often linked to a power source through a relay commonly referred to as a contactor. A typical contactor includes a separate power path for each of the three motor phases. Contactor motion is typically provided magnetically as the result of power flow through a coil where the current though the coil is controlled by a control switch.

In many cases an overload relay is connected in series with the control switch for the contactor coil. When overload conditions occur, the overload relay opens thereby cutting off power to the contactor coil. When power to the coil is discontinued, the coil opens and power to the equipment is cut off.

Many overload relays have been designed such that, once tripped, the relay remains open to prevent current flow to the contactor until the relay is manually reset by a system operator. A common resetting device is a reset push button selectable by an operator to reset the relay thereby allowing current to flow to and to close the contactor coil which in turn provides current to the linked equipment.

For some applications industry standards require that re-settable relays be openable when overload conditions occur even if the reset button is continually inadvertently or manually held down. These overload relays that are openable even while the reset button is pressed are generally referred to as "trip free" relays and that term will be used hereinafter to refer to such configurations.

An exemplary trip free relay configuration includes a bi-stable armature that is operably linked to contacts to open a first set of contacts and close a second set of contacts when in a set position and to close and open the first and second sets when in a tripped position. Here, to reset the armature and hence the contacts after the relay trips, a button and a rigid linking member are provided where the rigid linking member is spring mounted to the armature and extends toward and contacts the button when the armature is in the tripped position. When the button is pressed, button force is transferred through the linking member to the armature thereby causing the armature to rotate toward the set position. The linking member is designed so that, as the armature approaches the set position, the linking member decouples from the button. If an over current condition occurs after the linking member decouples from the button and while the button is pressed, the relay can assume the tripped position again.

There are other advantageous features that may be included in a relay. For example, for test purposes, it is advantageous to provide a relay configuration where the relay can be manually tripped (i.e., a "manual trip" feature). As another example, it is sometimes advantageous to provide a relay where at least one of the normally closed relay contacts can be opened for a short period to momentarily interrupt power to linked equipment (i.e., an "open circuit" feature). As one other example, sometimes it is advantageous to provide a relay that can be automatically reset when overload conditions cease to exist (i.e., an "automatic reset" feature). A relay configuration including all of the features described above will be referred to hereinafter as a "fully featured" relay.

In addition to the mechanical components described above, a fully featured relay assembly also typically includes a printed circuit board (PCB) including control circuitry for tripping and automatically resetting the relay, current sensors and various types of terminals for linking to power lines, the contactor and perhaps indicating lights.

Past known mechanical trip free relay configurations have been designed to include a housing generally forming a single housing compartment or cavity including features for mounting all of the required trip free relay components. For instance, an exemplary known trip free housing assembly includes structure for mounting a trip free sub-assembly, a manual reset sub-assembly, an open circuit sub-assembly, the PCB, the current sensors and the connection terminals. Here it has generally been believed that a reduced parts count when a single housing was employed would result in reduced manufacturing costs.

Unfortunately, while the single housing approach to trip free relay design generally reduces parts count, expected cost savings from parts count reduction has never been realized. The disconnect between parts count and cost is in great part due to increased manufacturing difficulties attributable to the single housing designs. To this end, while the size of a typical single housing assembly is generally increased to accommodate all of the required trip free relay components, tolerances between housing structure for mounting components have not been commensurately increased. Here, for instance, trip free sub-assembly tolerances generally have to remain within a relatively small range in order for a trip free sub-assembly to work properly. As well known in the manufacturing arts, where dimensions (e.g., housing dimensions) are increased and tolerances (e.g., trip free sub-assembly tolerances) remain the same, more precise and hence more costly manufacturing techniques have to be adopted to meet tolerance limits. Thus, more complex manufacturing techniques required to manufacture single housing trip free relays have generally increased relay costs more than the reduction in parts count has reduced costs.

BRIEF SUMMARY OF THE INVENTION

It has been recognized that the PCB associated with a mechanical trip free relay configuration can be placed outside a relay housing thereby reducing overall housing dimensions. Reduced housing dimensions simplify the task of meeting manufacturing tolerances and therefore reduce overall relay costs despite, in at least some cases, increasing overall parts count. Also, in this regard, in at least some cases, it is believed that reduced dimensions will lead to even more accurate cost effective tolerance capabilities and hence better working and new trip free mechanisms not thought possible prior to this concept.

It has also been recognized that, where all mechanical trip free relay components are placed within a single housing and the associated PCB is placed outside the relay housing, it is advantageous in at least some embodiments to provide PCB linkable pins that extend from the relay housing and that are suitable for linkage to the associated PCB. In at least some embodiments the PCB pins extend form one side of the housing and are arranged in a predefined pattern that matches a pattern of linkages on the associated PCB to facilitate easy linkage.

Consistent with the above, the invention includes an assembly for use with a printed circuit board (PCB), the assembly comprising a relay assembly including a relay housing and a trip free reset assembly mounted within the housing and linked to other relay components mounted within the housing for manually resetting the relay after the relay is tripped and at least one pin linked to at least one of the relay components and including a distal end extending from the housing and suitable for direct connection to the PCB.

In at least some embodiments the assembly also includes a manual trip assembly mounted within the housing and linked to other relay components for manually tripping the relay when the relay is set. In some embodiments the relay includes at least one normally closed contact and a manual open circuit member assembly mounted within the housing to other relay components for manually momentarily opening the at least one normally closed contact.

In at least some cases the reset assembly, the trip assembly and the open circuit assembly include reset, trip and open circuit members for activating the assemblies, respectively, and each of the reset member, the trip member and the open circuit member are provided within the first wall member. More specifically, in some cases the housing further includes at least a second wall member opposite the first wall member and wherein the at least one pin extends from the second wall member.

In some embodiments the at least one pin includes a plurality of pins and each of the pins extends from the second wall member in substantially the same direction. The assembly may be for use with a PCB that forms PCB traces having a specific pattern wherein the at least one pin includes at least two pins and wherein the at least two pins are juxtaposed so as to be directly linkable to at least two suitable PCB traces.

The invention is particularly useful for bi-stable trip free relays.

The invention also includes a method for configuring a relay/printed circuit board (PCB) assembly, the method comprising the steps of providing a PCB including electrical traces, providing a relay assembly including a relay housing and a trip free reset assembly mounted within the housing and linked to other relay components mounted within the housing for manually resetting the relay after the relay is tripped, the relay assembly also including at least one pin linked to at least one of the other relay components and including a distal end that extends from the housing and linking the distal end directly to at least one of the electrical traces on the PCB.

In addition, the invention includes an assembly for use with a printed circuit board (PCB), the assembly comprising a relay assembly including a relay housing and a trip free reset assembly mounted within the housing and linked to other relay components mounted within the housing for manually resetting the relay after the relay is tripped, the reset assembly including a reset member selectable for activating a trip free reset, the reset member moving along an activation axis when activated and at least one pin linked to at least one of the relay components and including a distal end suitable for direct connection to the PCB, the pin extending in a direction substantially parallel to the activation axis and from the housing.

Moreover, the invention includes a relay-printed circuit board (PCB) assembly comprising a PCB including a pattern of traces, a relay assembly including a relay housing and a trip free reset assembly mounted within the housing and linked to other relay components mounted within the housing for manually resetting the relay after the relay is tripped and at least one pin linked to at least one of the relay components and including a distal end extending from the housing and directly linked to at least one of the traces.

Furthermore, the invention includes an assembly for use with a printed circuit board (PCB), the assembly comprising a relay assembly including a housing, at least one normally closed contact, a trip free reset assembly, linked to other relay components for manually resetting the relay after the relay is tripped, a manual trip assembly linked to other relay components for manually tripping the relay when the relay is set and a manual open circuit assembly linked to other relay components for manually momentarily opening the at least one normally closed contact, each of the manual trip, reset and open circuit assemblies including an interface member for activating the associated assembly, each of the at least one normally closed contact, manual trip, reset and open circuit assemblies mounted within the housing and at least one pin linked to at least one of the relay components and including a distal end suitable for direct connection to the PCB.

These and other objects, advantages and aspects of the invention will become apparent from the following description. In the description, reference is made to the accompanying drawings which form a part hereof, and in which there is shown a preferred embodiment of the invention. Such embodiment does not necessarily represent the full scope of the invention and reference is made therefore, to the claims herein for interpreting the scope of the invention.

BRIEF DESCRIPTION OF THE SEVERAL VIEWS OF THE DRAWINGS

FIG. 12 is a cross-sectional view taken along the line 12—12 of FIG. 2 wherein the relay components are in the first or set position;

FIG. 14 is a top plan view taken along the line 14—14 of FIG. 12;

FIG. 15 is similar to FIG. 13 albeit illustrating a manual trip operator in a tripped position;

FIG. 16 is similar to FIG. 14 albeit illustrating the manual trip operator in the tripped position;

DETAILED DESCRIPTION OF THE INVENTION

Figure 1:
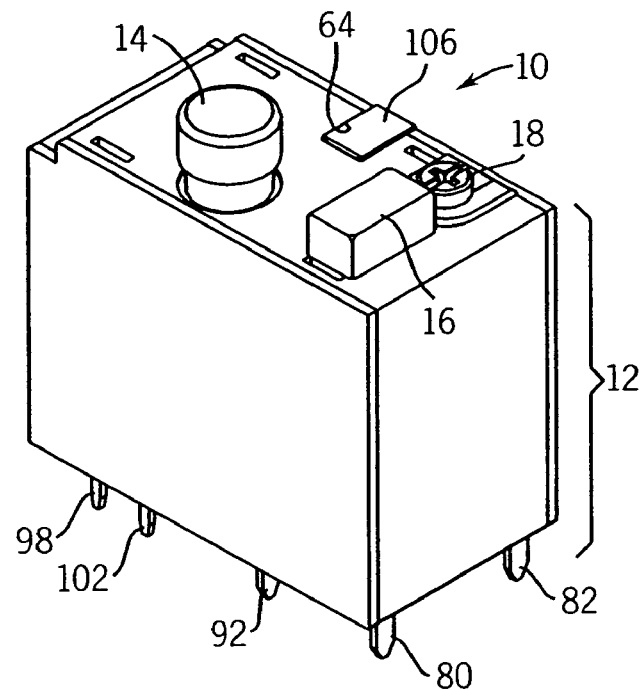
FIG. 1 is a perspective view of a relay configuration according to at least one embodiment of the present invention.

Referring now to the drawings wherein like reference numerals and labels correspond to similar elements throughout several views and, more specific, referring to FIG. 1, the present invention will be described in the context of exemplary trip-free relay configuration 10. Configuration 10 includes a plurality of components that are housed within a relay housing generally identified by numeral 12 that are linkable to other electronic circuitry (e.g., a printed circuit board (PCB)) via a plurality of electrically conductive pins or terminals extending from an underside of housing 12.

Generally, the pins include first, second, third and fourth pairs where each first pair pin is integrally connected to a separate normally open contact, each second pair pin is integrally connected to a separate normally closed contact and the third and fourth pin pairs are used to change the states (e.g., open or closed) of the relay contacts. For example, when current flows from the first pin to the second pin of the third pin pair the relay may trip thereby opening the normally closed contacts and closing the normally open contacts. Similarly, when current flows from the first pin to the second pin in the fourth pair the relay may be reset thereby closing the normally closed contacts and opening the normally open contacts. Hereinafter the normal or set relay state (i.e., where the normally closed and normally open contacts are closed and open, respectively) will be referred to as a first state where relay components are in a first position and the tripped state will be referred to as a second state where the relay components are in a second position. In addition, the third pin pair used to trip the relay will be referred to as the trip pair and the fourth pair used to reset the relay will be referred to as a reset pair.

Figure 2:
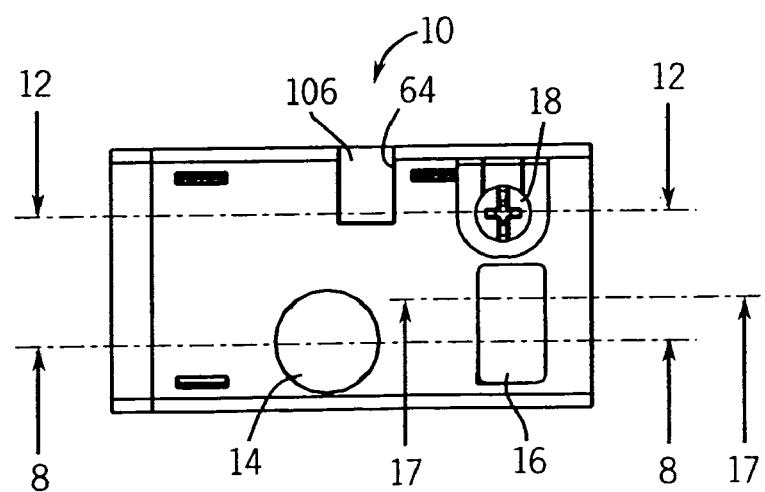
FIG. 2 is a is a top plan view of the relay of FIG. 1.

Referring to FIGS. 1 and 2, relay 10 includes a trip free reset operator or button 14, a manual trip operator or turn screw 18 and a manual open circuit operator or button 16. Reset operator or button 14 is linked to relay components such that, when the relay components are in the second position (i.e., the relay has been tripped and normally closed and normally open contacts are open and closed, respectively), pressing or activating button 14 resets the relay components to closed the normally closed contacts and open the normally open contacts. The relay components operably linked to button 14 are of the trip-free design such that, if current is applied to the reset pin pair (e.g., the fourth pin pair described above) while button 14 is pressed, the relay components are forced into the second or tripped position, hence the label "trip-free" indicating that the relay is free to trip independent of the position of button 14.

Manual trip turn screw 18 is operably linked to relay components such that, when the relay components are in the first or set position, activation of operator 18 manually forces the relay contacts into the second or tripped position wherein normally open and normally closed contacts are closed and open, respectively. As its label implies, open circuit button 16 is provided to facilitate manual opening of one of the normally closed contacts within relay 10. More detailed operation of operators 14, 16 and 18 is provided below.

Figure 3:
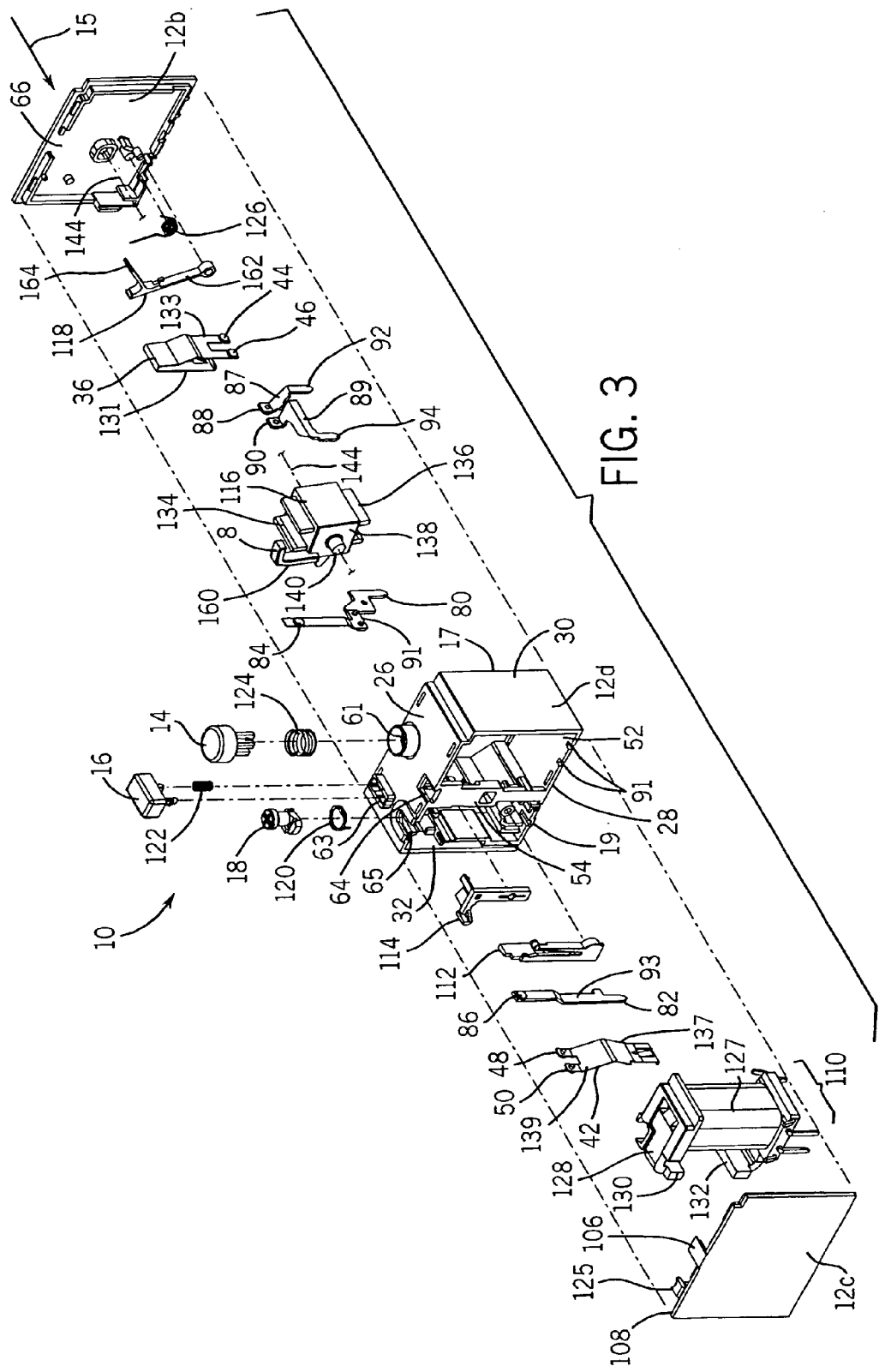
FIG. 3 is an exploded view of the relay of FIG. 1.

Referring now to FIG. 3, generally, housing 12 includes first, second and third housing members 12a, 12b and 12c, respectively and, in addition to buttons 14 and 16 and turn screw 18, relay 10 includes a core/coil assembly 110, a first leaf spring member 36, a second leaf spring member 42, first through fourth stationary contact members 87, 89, 91 and 93, respectively, an intermediate trip member 112, an intermediate open circuit member 114, a bi-stable armature member 116, a push arm 118, a push arm spring 126, and first, second and third operator springs 124, 120 and 122, respectively.

First member 12a includes a top wall 26, a bottom wall 28 (also referred to as first and second wall members) and first and second lateral walls 30 and 32 that together form a substantially rectilinear box about a recess or cavity 52 where the cavity 52 is sized, shaped and designed to receive other relay 10 components.

To simplify this explanation, a specific relay orientation will be assumed so that relative juxtapositions of relay components can be easily described. To this end, referring to FIGS. 3 and 8, unless indicated otherwise, the assumed orientation will be with top wall 26 generally above other relay components and substantially horizontal with a view along the direction indicated by arrow 15 (see FIG. 3) so that housing member 12a includes a front end or edge 17 and a rear end or edge 19. Thus, when observed from a front side relay components appear as in FIG. 8 and, generally, when viewed from a rear side, relay components appear as in FIG. 9.

Referring again to FIG. 3, in order to mount at least some of the relay components within recess 52 some structure is provided within housing member 12a including a central member 54 that traverses the distance between top and bottom walls 26 and 28, respectively, along the rear edge 19 of member 12a. Central member 54 forms a central aperture 56 about midway along its length for mounting armature member 116 as described in greater below. In addition, referring also to FIG. 12 (i.e., a rear view of the assembly)

an extension 69 from bottom wall into recess 52 forms another cylindrical aperture 71 for receiving a pivot post (not separately labeled) that extends from intermediate trip member 112 for mounting member 112 relative to turn screw 18 and armature member 116 such that rotation of screw 18 is translated to a force on armature member 116 causing member 116 to rotate from the set to the tripped positions (i.e., thereby opening and closing normally closed and normally open contacts, respectively). Moreover, referring to FIG. 17, a post 81 is also provided for mounting intermediate open circuit member 114 and orienting member 114 with respect to button 16 thereabove and one of the normally closed contacts so that when button 16 is pressed, button movement is translated to the contact to open the contact.

Other structures formed by first housing member 12a include a plurality of slots and specifically dimensioned spaces specially designed to receive and mount each of core/coil assembly 110, leaf springs 36 and 42 and contact members 87, 89, 91 and 93.

Figure 8:
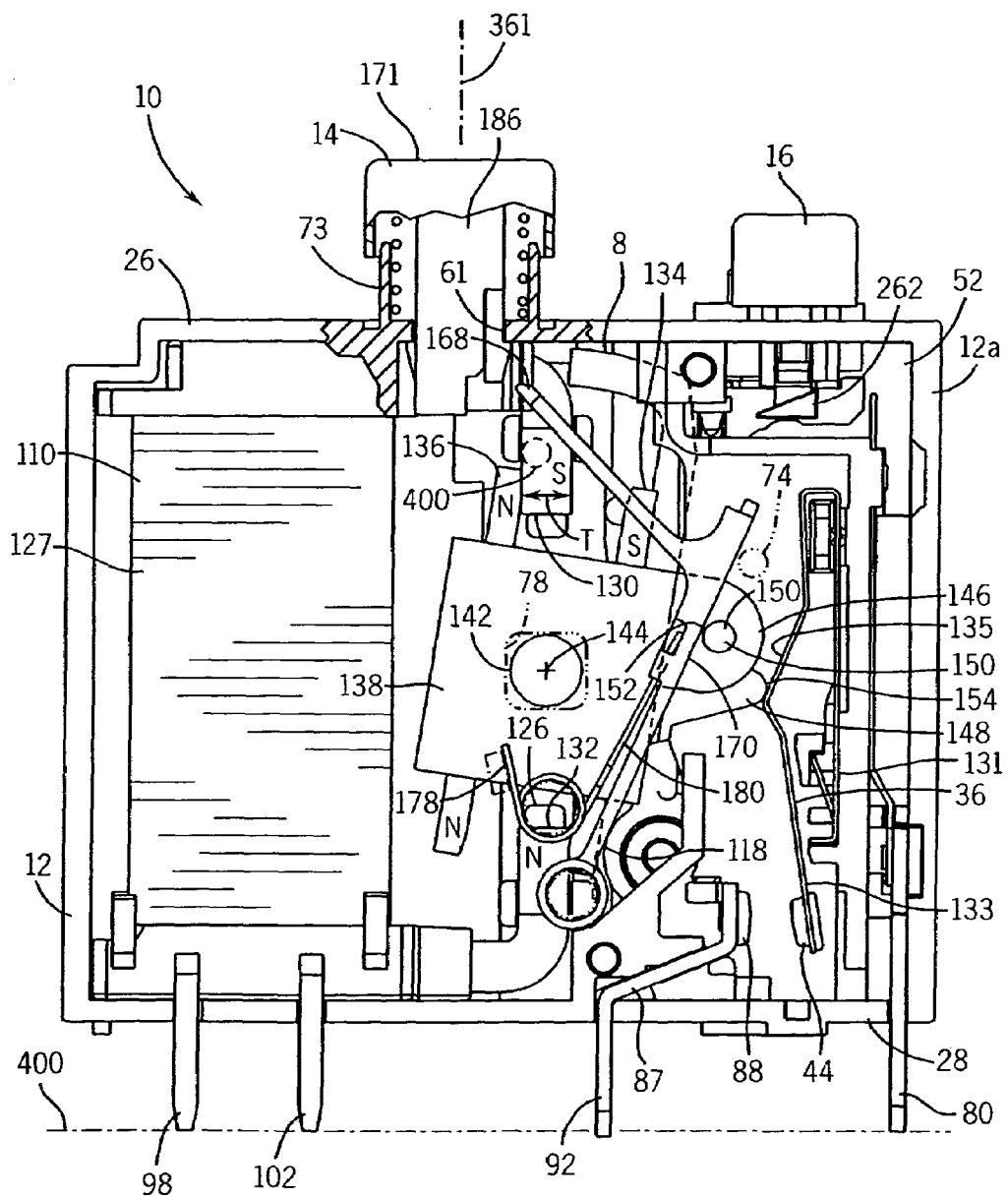
FIG. 8 is a cross-sectional view taken along the line 8—8 of FIG. 2 wherein the relay components are in a first or set position.
Figure 17:
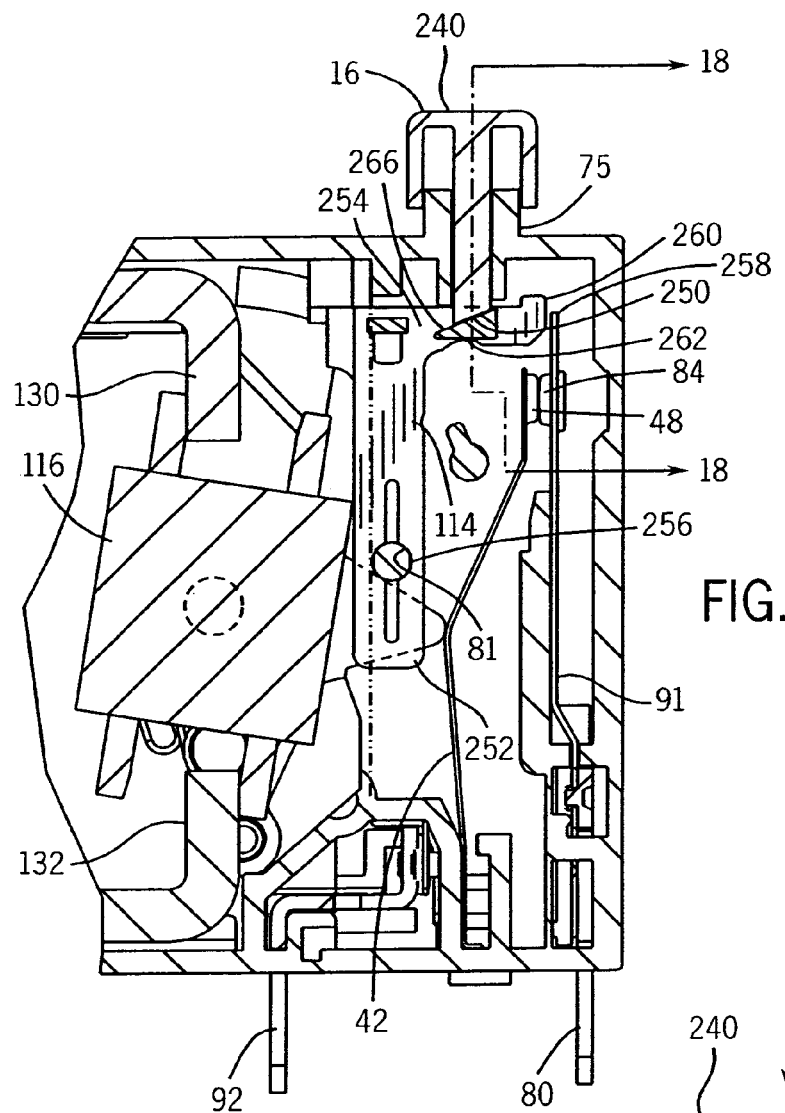
FIG. 17 is a cross-sectional view taken along the line 17—17 in FIG. 2 illustrating various relay components relating to an open circuit linkage mechanism.

Referring still to FIG. 3, top wall 26 forms four apertures including first through third apertures 61, 62 and 65 for accommodating interface members or operators 14, 16 and 18, respectively, and a viewing aperture 64. Referring also to FIGS. 8 and 17, collars 73 and 75 are provided around each of apertures 61 and 63 for guiding the associated buttons 14 or 16 along their strokes between deactivated positions and pressed and activated positions. Each of apertures 61 and 63 is formed proximate front edge 17 and aperture 61 is centrally formed about an activation axis 361 for button 14.

Referring still to FIG. 3, third aperture 65 is open to back edge 19 so that turn screws 18 can be received therein via insertion perpendicular to an axis of rotation formed by screw 18. Viewing aperture 64 is, in the illustrated embodiment, a square aperture that, like aperture 65, is open to back edge 19. Aperture 64 is formed essentially in line with central member 54. As described below, aperture 64 is provided to enable visual determination of the location of one of the relay components (e.g., a flag surface of a component) that changes position as the relay state is altered between the set and tripped states so that relay state can easily be visually determined.

Figure 9:
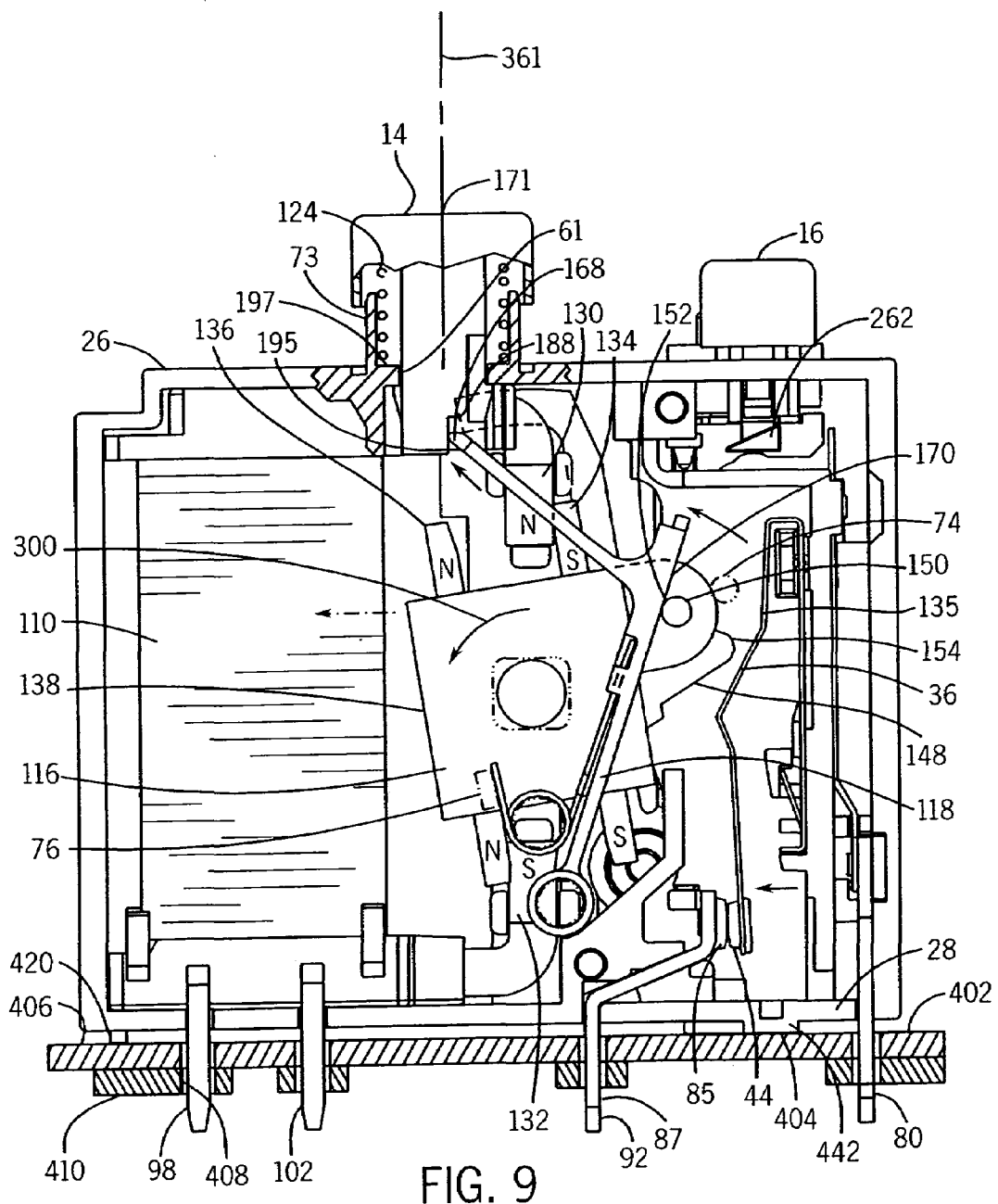
FIG. 9 is a view similar to FIG. 8 albeit where the relay components are in a second or tripped position.

Referring again to FIG. 3, bottom wall 28 forms pin openings (e.g., two identified by numeral 91) for passing pins (e.g. 80, 82, 92, 94, 98, 100, 102 and 104). Referring also to FIGS. 8 and 9, bottom wall member 28 defines a substantially flat bottom housing plane 404. Herein, while the structure above is not described in detail, it should suffice to say that this structure securely orients the relay components and parts of the components as described above and hereinafter.

Figure 5:
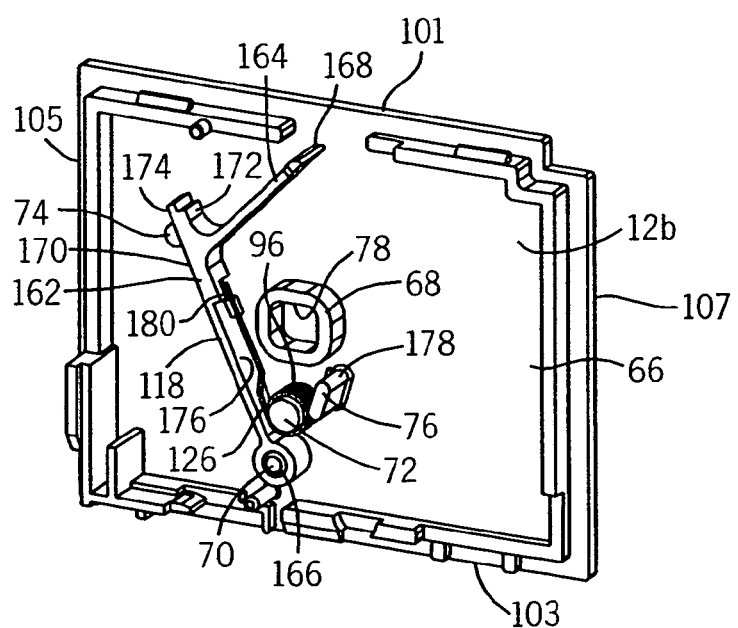
FIG. 5 is a perspective view of a housing member, a push arm and an associated spring according to one aspect of the present invention.

Second housing member 12b is generally a planer member having a top edge 101, a bottom edge 103, a first lateral edge 105 and a second lateral edge 107 sized and shaped to close the opening of recess 52 to one side of member 12a thereby substantially closing that side of the recess. Referring also to FIG. 5, various additional features are provided on an internal surface 66 of second member 12b including five separate constructs that extend from surface 66 for supporting, limiting, and/or carrying other relay components. To this end, the five extending members include a collar member 68, a push arm pivot post 70, a spring support post 72, a push arm stop member 74 and a spring limiting member 76. Collar member 68 extends generally from a central section of surface 66 and forms a central aperture 78 such that, when second member 12b is received within the opening formed by member 12a to close recess 52, central aperture 78 and central aperture 56 formed by central member 54 are essentially aligned along the same axis.

Spring support post 72 is generally a cylindrical small diameter post which extends from surface 66 approximately midway between member 68 and bottom edge 103. Push arm pivot post 70 is also a cylindrical small diameter post that extends from surface 66 and is located approximately midway between spring support post 72 and bottom edge 103. Spring limiting member 76 is generally positioned vertically between collar member 68 and spring support post 72 and is offset toward second lateral edge 107. Member 76 forms a limiting surface 96 which faces the space between collar member 68 and spring support post 72. Push arm stop member 74 in the illustrated embodiment is a cylindrical small diameter post that extends from surface 66 laterally approximately midway between collar member 68 and first lateral edge 105 and vertically approximately midway between collar member 68 and top edge 101. A precise position of member 74 is important relative to other relay components described below and that relative juxtaposition will be described in greater detail below. Although various mechanical and or chemical (e.g., glue) options are contemplated for securing second member 12b to first member 12a, in the illustrated embodiment, structure for snap fitting the members 12a and 12b together is provided. The invention should not be limited by the type of mechanical components or chemical options used to secure the housing members.

Referring once again to FIG. 3, third housing member 12c is generally a planer member that is receivable within a backend opening formed by back edge 19 to substantially close the back end opening. In at least some embodiments member 12c is formed of clear plastic material so that the internal position of at least some of the relay components is observable therethrough. Housing member 12c includes a substantially rectilinear window member 106 that extends from a top edge 108 and essentially perpendicular to the main part of member 12c. Window member 106 is sized, shaped and juxtaposed so as to be receivable within viewing aperture 64 thereby mechanically sealing off aperture 64 while still allowing observation therethrough.

In addition to member 106, a partial collar extension member 125 also extends from top edge 108 in the same direction as member 106. Member 125 is sized, shaped and juxtaposed such that, when member 12c closes the opening formed by back edge 19, member 125 is received within third aperture 65 and, together with a portion of the aperture 65, forms a generally circular opening for passing a shaft of turn screw 18. Like second member 12b, third member 12c, in the illustrated embodiment, snap fits into secure engagement with first member 12a to close the associated opening. When housing members 12a, 12b and 12c are secured together they form a housing volume.

Referring to FIGS. 3 and 8, first leaf spring member 36 is formed of a metallic sheet material bent into a form including a mounting end 131 and a contact end 133 where the portions of spring member 36 that form ends 131 and 133 are generally parallel to each other. Contact end 133 is bifurcated so as to form two separate moveable contacts 44 and 46. Proximate contact end 133, member 36 is bent away from end 131 thereby forming an inclined surface 135.

Referring to FIGS. 3 and 12 second leaf spring member 42 is also formed of a metallic sheet material bent into a form including a mounting end 137 and a contact end 139 where the contact end 139 is bifurcated to form two separate contacts 48 and 50. Between ends 137 and 139 member 42 forms an inclined surface 153.

Contact member 87 includes integrally formed contact 88 and pin 92. Similarly, contact member 89 includes integrally formed contact 90 and pin 94, member 91 includes contact 84 and pin 80 and member 93 includes contact 86 and pin 82. Member 93 is generally flexible whereas each of contact members 87, 89 and 91 may be rigid and/or may be mounted so that they are rigidly supported. In some embodiments herein contacts 88 and 90 may be referred to as two first contacts, contacts 44 and 46 may be referred to as two second contacts, contacts 84 and 86 may be referred to as two third contacts and contacts 48 and 50 may be referred to as two fourth contacts.

In at least some embodiments the openings (e.g., 91) through which the distal ends of pins (80, 82, 92, etc.) extend are formed such that the distal ends of the pins all generally extend from the housing 12 in a first direction or so that they can terminate a single plane.

Referring also to FIG. 9, in at least some embodiments all of the pins are generally parallel and extend in the same direction or at least the distal ends of the pins are parallel and extend in the same direction. Here, because typical PCBs include apertures (e.g., 408) for receiving pins from electronic devices, if at least the distal ends of the pins are parallel and properly spaced, mechanical and electrical linkage of the relay to the PCB is easily facilitated via reception of pins in apertures followed by soldering to link pins to traces (e.g., 416) on the PCB 402 Where the apertures 408 are large the distal ends need only be substantially parallel.

In other PCB cases where the PCB does not include apertures but instead include flat electrical traces (e.g., 410 in FIG. 9) that devices are to be soldered to, the distal ends of the pins should generally be within a single connection plane 400 so that robust electrical linkage can be made.

As illustrated in FIG. 9, in at least some cases a flat mounting surface 406 is formed by a PCB and the relay 10 may be mounted to PCB 402 such that the flat housing plane 404 rests on and is supported by mounting surface 406. In this case, strains that result from interfacing with manual reset, trip and open circuit operators can be transferred directly through the housing member 12a to the supporting PCB 402 and are not placed on the pins 80, 82, 92, etc. This is particularly true in cases where operator activation is along an activation axis 361 that is essentially parallel to pin extensions and hence essentially perpendicular to plane 404 and 406 as in FIG. 9. In FIG. 9 small extensions 420, 422 form the effective plane 404 of wall member 28 that contacts mounting surface 406.

Referring to FIG. 9, leaf spring 36 and contact members 87 and 89 (view of members 89 blocked by member 87 in FIG. 9) are mounted within recess 52 such that contacts 44 and 46 are biased toward and contact contacts 88 and 90 unless otherwise restricted. Similarly, referring to FIG. 13, leaf spring 42 and contact members 93 and 91 (view of member 91 blocked by member 93 in FIG. 13) are mounted within recess 52 such that contacts 48 and 50 are biased away from and are separate from contacts 84 and 86 unless otherwise restricted.

Figure 7:
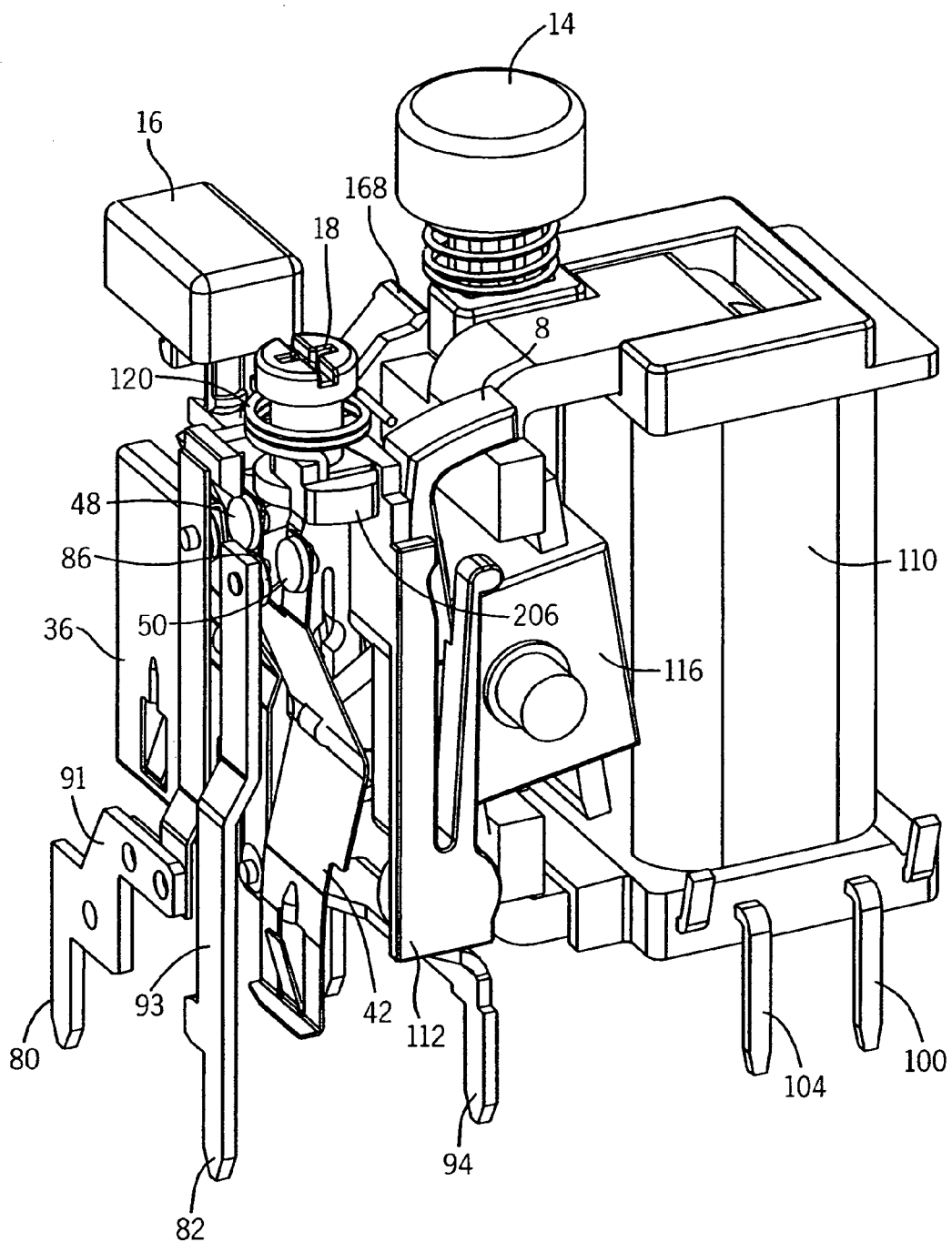
FIG. 7 is similar to FIG. 6, albeit being a perspective view from a different angle.

Referring to FIGS. 3, 7 and 8, core/coil assembly 110 generally includes a C shaped metallic core member 128 and first and second coils collectively identified by numeral 127 wound therearound in opposite directions where the first coil connects pins 98 and 100 and the second coil connects pins 102 and 104. Facing ends 130 and 132 of core member 128 each have a thickness T and have polarities that are a function of which one of the first and second coils has been most recently excited and the position of armature 116.

Hereinafter, pins 98 and 100 and the associated coil will be referred to as trip pins and the trip coil, respectively, and pins 102 and 104 and the associated coil will be referred to as reset pins and the reset coil, respectively. When current is provided to trip pin 98, ends 130 and 132 have north and south polarities, respectively, whereas, when current is provided to reset pin 102, ends 130 and 132 have south and north polarities, respectively. As illustrated best in FIG. 8, core/coil assembly 110 is mounted within one-half of first housing member 12a such that first and second ends 130 and 132 form a space therebetween that is generally aligned with a central axis 144 formed by collar member 68 and central aperture 56.

Referring once again to FIG. 3, bistable armature member 116 includes first and second magnetic members 134 and 136, respectively, and a plastic mechanical linkage member 138. First member 134 is generally a magnetic north pole member while second member 136 is generally south sole pole member. Structure internal to member 116 for forming north and south poles is known i the art and will not be described here in detail. The two members 134 and 136 are mounted within slots (not separately labeled) in linkage member 138. The adjacent ends of members 134 and 136 form spaces therebetween having dimensions that are greater than the thickness T of core ends 130 and 132 that are received therebetween when linkage member 138 is mounted within housing 12. In at least some embodiments, the dimension between proximate ends of members 134 and 136 is approximately twice thickness T.

Referring again to FIG. 3 and also to FIG. 8, linkage member 138 includes first and second centrally extending post members 140 and 142, respectively, that extend in opposite directions along pivot axis 144. Post members 140 and 142 are sized and shaped so that they are receivable within central aperture 56 and central aperture 78, respectively, for pivotal motion about axis 144. As best illustrated in FIG. 8, when bistable armature member 116 is mounted between apertures 62 and 78, core ends 130 and 132 should be juxtaposed between the adjacent ends of north and south pole members 136 and 134, respectively.

From the foregoing, it should be appreciated that, because of the magnetic configuration described above, linkage member 138 can be pivoted between first and second separate positions with respect to core ends 130 and 132. In this regard, when current is provided to trip coil pin 98 so that core ends 130 and 132 from north and south poles, respectively, (see FIG. 9), the top end of south pole member 134 is attracted to core end 130 and the bottom end of north pole member 136 is attracted to core end 132 thereby causing linkage member 116 to rotate into the position illustrated in FIG. 9. Similarly, when current is provided to reset coil pin 102 so that core ends 130 and 132 form south and north poles as in FIG. 8, respectively, the top end of north pole member 136 and the bottom end of south pole member 134 are attracted to the top and bottom core ends 130 and 132, respectively. Hereinafter, the linking member positions in FIGS. 8 and 9 will be referred to generally as the first and second or set and tripped positions, respectively.

Referring once again to FIG. 8, in addition to the features described above, linkage member 138 also includes first and second lateral extension members 146 and 148 that extend in the direction away from core/coil assembly 110 and generally perpendicular to the activation axis of button 14 when linkage member 138 is mounted within housing 12. A post 150 extends essentially perpendicularly to the surface of lateral extension member 146 and forms a first bearing surface 152 that generally faces assembly 110. Second lateral extension member 148 extends past member 146 and forms a cam surface 154 at its distal end which faces the inclined surface 135 of leaf spring 36 when relay 10 is assembled.

Referring now to FIG. 12, a view of the relay components similar to the view of FIG. 8, albeit from the opposite side, is provided. In FIG. 12, a third lateral extension member 156 can be observed that extends in the same direction from linkage member 138 as does each of the first and second lateral extension members. Third extension member 156, like second lateral extension member 148, forms a cam surface 158 at a distal end that faces the inclined surface 153 formed by spring 42.

While the second and third lateral extension members have similar characteristics, each is slightly different and has been specifically designed to interact differently with an associated leaf spring when armature member 116 is in the set and tripped positions. To this end, as will be described in greater detail below, when armature 116 is in the set position (see again FIG. 8), cam surface 154 of second lateral extension member 148 contacts inclined surface 135 of leaf spring 36 thereby forcing contacts 44 and 46 open with respect to adjacent contacts 88 and 90, while cam surface 158 of third lateral extension member 156 (see again FIG. 12) mechanically pushes on inclined surface 153 thereby closing contacts 48 and 50 to adjacent contacts 84 and 86, respectively.

Referring to FIG. 9, when armature 116 is in the tripped position as illustrated, cam surface 154 of second lateral extension member 148 does not contact spring 36 and leaf spring 36 forces contacts 44 and 46 closed with contacts 92 and 94, respectively. Similarly, referring to FIG. 13, when armature 116 is in the tripped position as illustrated, cam surface 158 of third lateral extension member 156 is in a position that allows leaf spring member 42 to open contacts 48 and 50 with respect to adjacent contacts 84 and 86, respectively.

Figure 13:
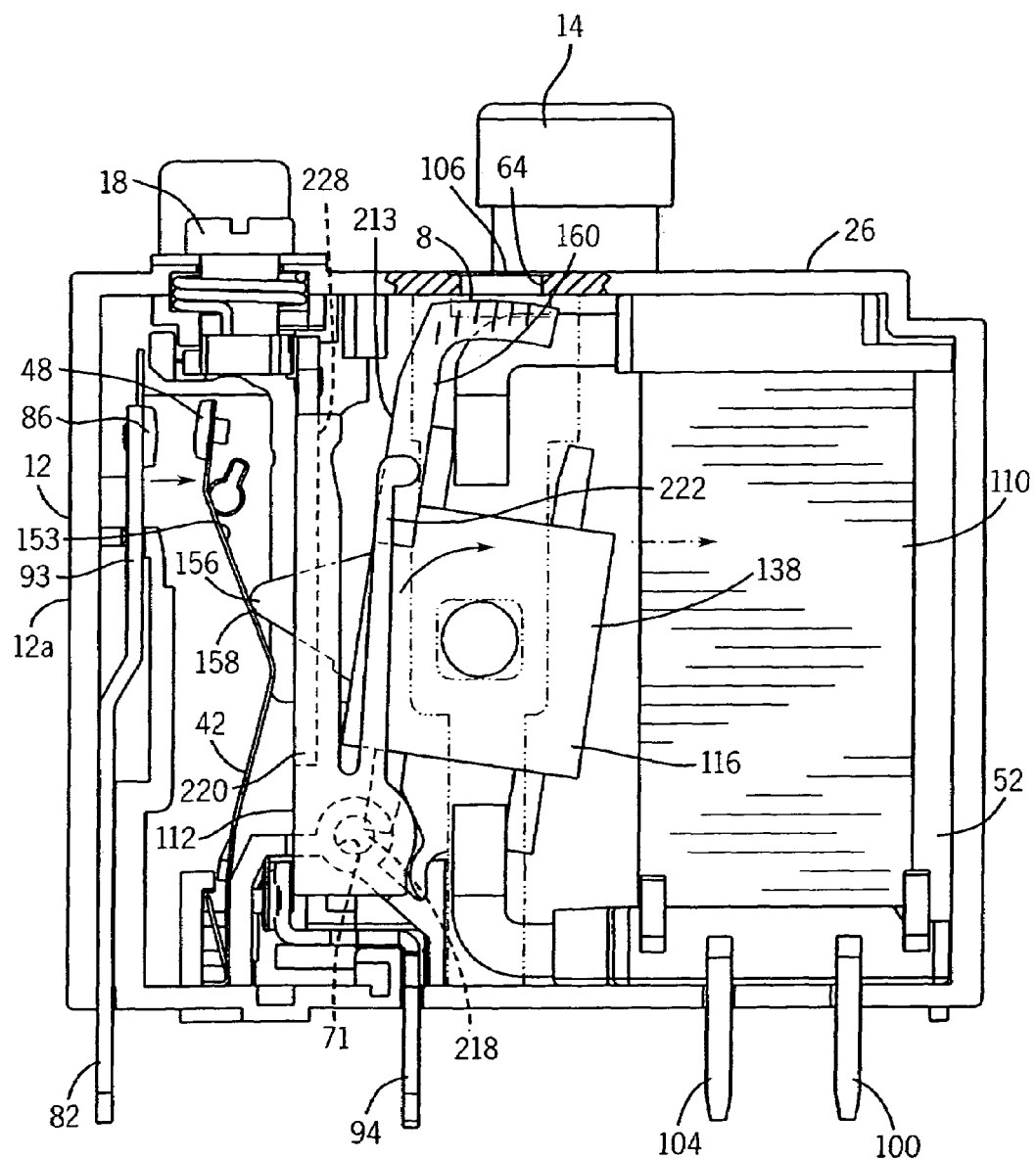
FIG. 13 is similar to FIG. 12, albeit where the relay components are in the second or tripped position.

Referring now to FIGS. 3, 12 and 13, one additional feature of linkage member 138 that is interesting from the perspective of the present invention is a flag member 160 that extends from member 138 and forms a flag surface 8. Member 160 is sized and juxtaposed with respect to pivot axis 144 such that, when linkage member 138 is in the set position illustrated in FIG. 12, surface 8 is not adjacent window 64 and therefore cannot be seen through window 64. However, when linkage member 138 is in the tripped position illustrated in FIG. 13, surface 8 is directly below opening 64 and is observable through the clear plastic window formed by member 106. In at least some embodiments surface 8 is a bright color (e.g., yellow) which is easily visually detectable when present below opening 64 so that relay state can be determined quickly and easily. Member 160 also forms a trip surface 213 on a side that faces in the same general direction as member 156.

Figure 6:
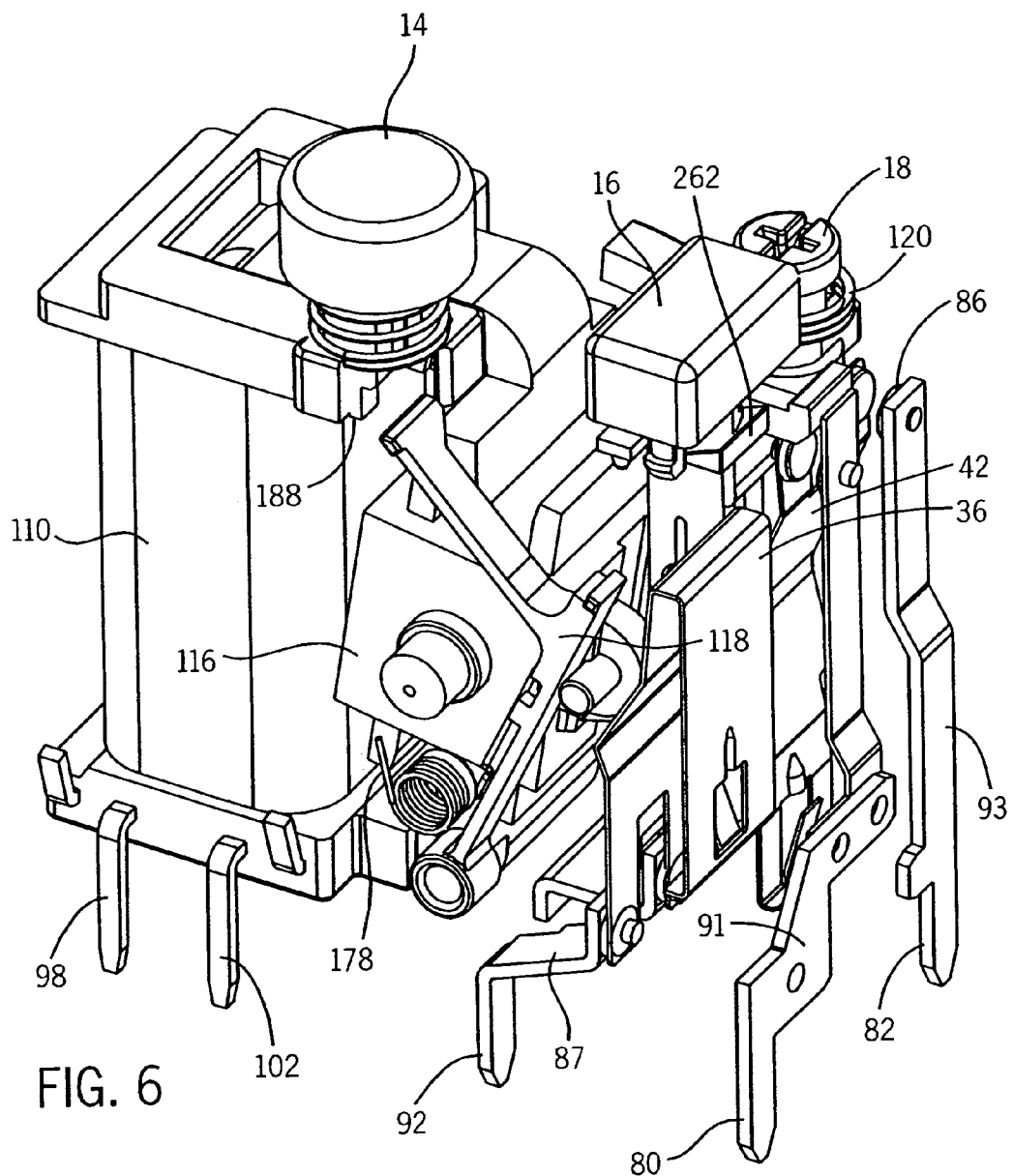
FIG. 6 is a perspective of the internal components and operators of the relay of FIG. 1.

Referring once again to FIG. 3 and also to FIGS. 5, 6 and 8, push arm 118 includes first and second leg members 162 and 164, respectively. First leg member 162 has first and second opposite ends and forms a post receiving aperture 166 at the first end. Aperture 166 is sized to receive push arm pivot post 70 to allow rotation of arm 118 thereabout. Second leg member 164 extends proximate the second end of first leg member 162 forming an angle therewith which is approximately 90° but maybe an angle within a range about 90°. For instance, the range of angles may be, in at least some embodiments, between 60° and 120°. Second leg member 164 forms a distal end 168. The surface of first leg member 162 opposite the area where second leg member 168 extends from forms a push surface 170. Hereinafter, the distal end and push surface are also sometimes referred to as first and second push arm bearing surfaces. In the illustrated embodiment, an arm member 172 extends from the second end of second leg member 162 a small distance and forms a limiting surface 174 which is essentially parallel to push surface 170. Leg member 162 forms a spring limiting surface 176 on the same side to which second leg member 164 extends. Push arm 116 is formed of a rigid, resilient plastic material so that each of leg members 162 and 164 may temporarily deform but, in steady state, returns to its original form.

Referring still to FIG. 5, in the illustrated embodiment, push arm 118 is mounted to second housing member 12b by receiving push arm pivot post 70 within post receiving aperture 166 and so that first leg extension 162 extends up and between collar member 68 and push arm stop member 74 and so that limiting surface 174 rests on push arm stop member 74. When push arm 118 is mounted as described above, spring limiting surface 176 and limiting surface 96 form a limiting angle $\phi$ (not labeled) therebetween.

Referring still to FIGS. 3, 5, 6 and 8, push arm spring 126 is generally a torsional spring having a helical central section that forms a spring cylinder opening and first and second extending members 178 and 180, respectively, that extend therefrom to generally define a spring angle $\beta$ (not labeled) when unloaded. The spring cylinder opening is slightly larger than spring support post 72 and is receivable thereon. Spring angle $\beta$ is a few degrees wider (e.g., 10–15 degrees) than the limiting angle $\phi$ formed by limiting surfaces 176 and 96. Thus, when spring 126 is mounted on post 72 with members 178 and 180 compressed between surfaces 96 and 176, respectively, spring 126 biases push arm 118 and, more specifically, limiting surface 124 against stop member 74.

Referring once again to FIG. 9, when push arm 118 and spring 126 are properly mounted to second housing member 12b and member 12b is mounted to first housing member 12a to close the opening formed by front edge 17, push arm 118 is juxtaposed within recess 52 such that distal end 168 resides below aperture 61 formed in top wall member 26 for reset operator 14. In addition, the push surface 170 formed by first leg member 162 is juxtaposed adjacent first bearing surface 152 formed by post 150 (i.e., the bearing surface formed by post 150 that is integrally formed with linkage member 138).

Figure 4:
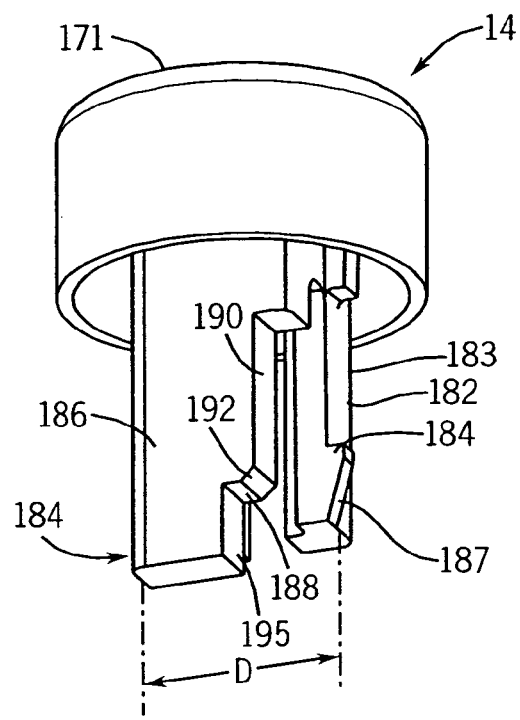
FIG. 4 is an enlarged perspective view of the reset operator button of FIG. 3.

Referring once again to FIG. 8 and also to FIG. 4, operator or button 14 includes a flat pad surface 171 and first and second extension members 182 and 186 that extend therefrom, generally in the same direction. A dimension D formed by oppositely facing surfaces 183 and 185 of members 182 and 186 is similar to the diameter of aperture 61. Member 182 is rigid but flexible so that member 182 may flex toward member 186 thereby temporarily reducing the dimension between surfaces 183 and 185. A lip 184 with an inclined surface 187 is provided at a distal end of member 182.

Second extension member 186 forms first and second limiting surfaces 195 and 190, a second bearing surface 188 and an inclined surface 192. Limiting surface 195 is formed at a distal end of member 186 and is perpendicular to surface 171. Bearing surface 188 is formed adjacent limiting surface 195 and faces in the direction opposite surface 171. Limiting surface 190 is generally parallel to limiting surface 195, is formed along a mid-section of member 186 and faces in the same direction as surface 195. Inclined surface 192 is inclined from bearing surface 188 to limiting surface 190.

Referring now to FIGS. 4 and 9, to mount button 14 within aperture 61, helical spring 124 is placed within collar 173 formed about aperture 61 and is supported by a lip 197 therein formed by top wall 26. Next, members 182 and 186 are inserted through spring 124 and aperture 61, force on surface 187 causes member 182 to temporarily deflect toward member 186 and, once member 184 passes through aperture 61, member 182 flexes outward and member 184 secures button 14 within aperture 61.

Referring still to FIG. 9, the surfaces 190, 192, 188 and 195 of member 186 and push arm 116 are dimensioned and shaped such that, when armature 116 is in the second or tripped position as illustrated in FIG. 9 and when button 14 is not pressed, distal end 168 rests against limiting surface 195 below bearing surface 188.

Referring now to FIGS. 3, 12 and 14, operator or turn screw 18 includes a screw head 202, a shaft member 204 that extends from head 202 and a cam member 206 that extends laterally from the shaft 204 (i.e., perpendicular to the shaft). The shaft member 204 is sized to be rotatably receivable within the opening formed by recess 65 and member 125 when member 125 is received within recess 65.

Cam member 206 forms a cam surface 208 that forms a dimension with a screw axis 210 that varies such that, as screw 18 is rotated, the dimension between the axis 210 and the cam surface 208 along a specific direction is variable. Specifically, in the illustrated example, the dimension between axis 210 and a direction indicated by arrow 212 that is generally toward armature 116 is variable.

Spring 120 is a torsional spring including first and second ends (not labeled) that are receivable by housing member 12a and cam member 206 that biases screw 18 into the position illustrated in FIGS. 12 and 14 where a relatively small dimension is formed between axis 210 and cam surface 208. Thus, when screw 18 is rotated one quarter turn from the position in FIG. 14 to the position in FIG. 16, the axis-cam surface dimension is increased. When screw 18 is released, spring 120 rotates screw 18 back into the position in FIG. 14.

Referring still to FIGS. 3, 12 and 14, intermediate trip member 112 includes a base member 216 and first and second substantially parallel leg members 220 and 222 that generally extend in the same direction therefrom. Base member 216 forms a post 218 that extends from one side thereof, and essentially perpendicular to leg members 220 and 222. Post 218 is sized to be snugly receivable within opening 71 formed by member 69.

First leg member 220 forms first and second surfaces 226 and 228 on opposite sides. When member 112 is mounted within recess 52, surface 226 faces and rests against cam surface 208 (see FIGS. 14 and 16). Second surface 228 is separated from trip surface 213 when armature 116 is in the tripped position and screw 18 is not manually rotated (see FIG. 13). However, when armature 116 is in the set position as in FIGS. 12 and 14, surface 213 rests against second surface 228.

Referring still to FIGS. 12 and 14, second leg member 222 forms a limiting surface 230 at a distal end that faces in a direction away from member 220. When member 112 is mounted within recess 52, surface 230 abuts a facing surface 232 formed by post member 54 (shown in phantom in FIG. 12). Member 112, like member 118, is formed of a resilient and flexible plastic material so that leg members 220 and 222 may flex and operate like a spring.

Referring now to FIGS. 3 and 17 through 19, open circuit operator or interface member or button 16 includes a push surface 240 and two extension members 242 and 244 that extend in a direction away from surface 240. Each of members 242 and 244, like member 182 in FIG. 4, forms an inclined head member, the head member latching onto the internal surface of top wall 26 about aperture 63 to mount button 16 in a manner similar to the way in which button 14 is mounted as described above. In addition, member 242 also forms a sloped surface 250 at a distal end.

Intermediate open circuit member 114 is generally an "L" shaped member having first and second members 252 and 254 that form a 90° angle. Member 252 forms an aperture 256 for receiving post 81 to thereby mount member 114 within recess 52. When member 114 is mounted in recess 52, second member 254 extends toward a distal end 258 of contact member 91 and forms a surface 260 adjacent thereto. A wedge extension 262 extends laterally from second member 254 and below surface 250 forming a wedge surface 266. Helical spring 122 biases button 16 into a deactivated and extended position when button 16 is not pressed.

Referring once again to FIG. 8, as indicated above, when relay 10 is in its set or first state, armature 116 is rotated such that the top of member 136 and the bottom of member 134 contact core ends 130 and 132, respectively. When so positioned, the cam surface 154 of second extension member 148 contacts surface 135 thereby restricting movement of contacts 44 and 46 and holding those contacts in their normally open position. Also, when armature 116 is so positioned, referring to FIG. 12, cam surface 153 of third extension member 156 contacts surface 153 and forces contacts 48 and 50 against contacts 84 and 86 and in their normally closed position. At this point, push arm spring 126 biases push arm 118 against push arm stop member 74 (see also FIG. 5) and arm 118 is separated from both armature member 116 and operator 14. In addition, as best seen in FIG. 12, at this point flag surface 8 is not visible through aperture 64.

Referring to FIG. 9, when relay 10 is tripped either manually or via current provided at pin 98, armature 116 rotates counter-clockwise as indicated by arrow 300. When armature 116 rotates counter-clockwise, extension member 148 releases leaf spring 36 which thereafter closes contacts 44 and 46 with contacts 88 and 90, respectively. In addition, referring to FIG. 13, upon tripping, extension member 156 at least partially releases leaf spring 42 allowing contacts 48 and 50 to open with respect to contacts 84 and 86, respectively. In addition, when armature 116 is in the tripped position distal end 168 of arm 118 rests against limiting surface 195 and below bearing surface 188 (see FIGS. 4 and 9 in this regard) so that a space occurs between distal end 168 and bearing surface 188. Importantly, by designing the components so that a space may occur between end 168 and surface 188 button 14 and arm 118 tolerances can be reduced appreciably. Here, second member 164 length can be specified so that member 164 places some pressure of surface 195 and may deflect slightly (e.g., upward toward surface 188) if too long. Also note that, if member 164 has a length such that end 168 contacts surface 188, member 164 may simply deform (e.g., bend) a bit to accommodate the imperfection but will not preclude other components (e.g., the armature) from assuming desired positions. Moreover, at this point flag surface 8 is directly below and is observable through aperture 64.

Figure 10:
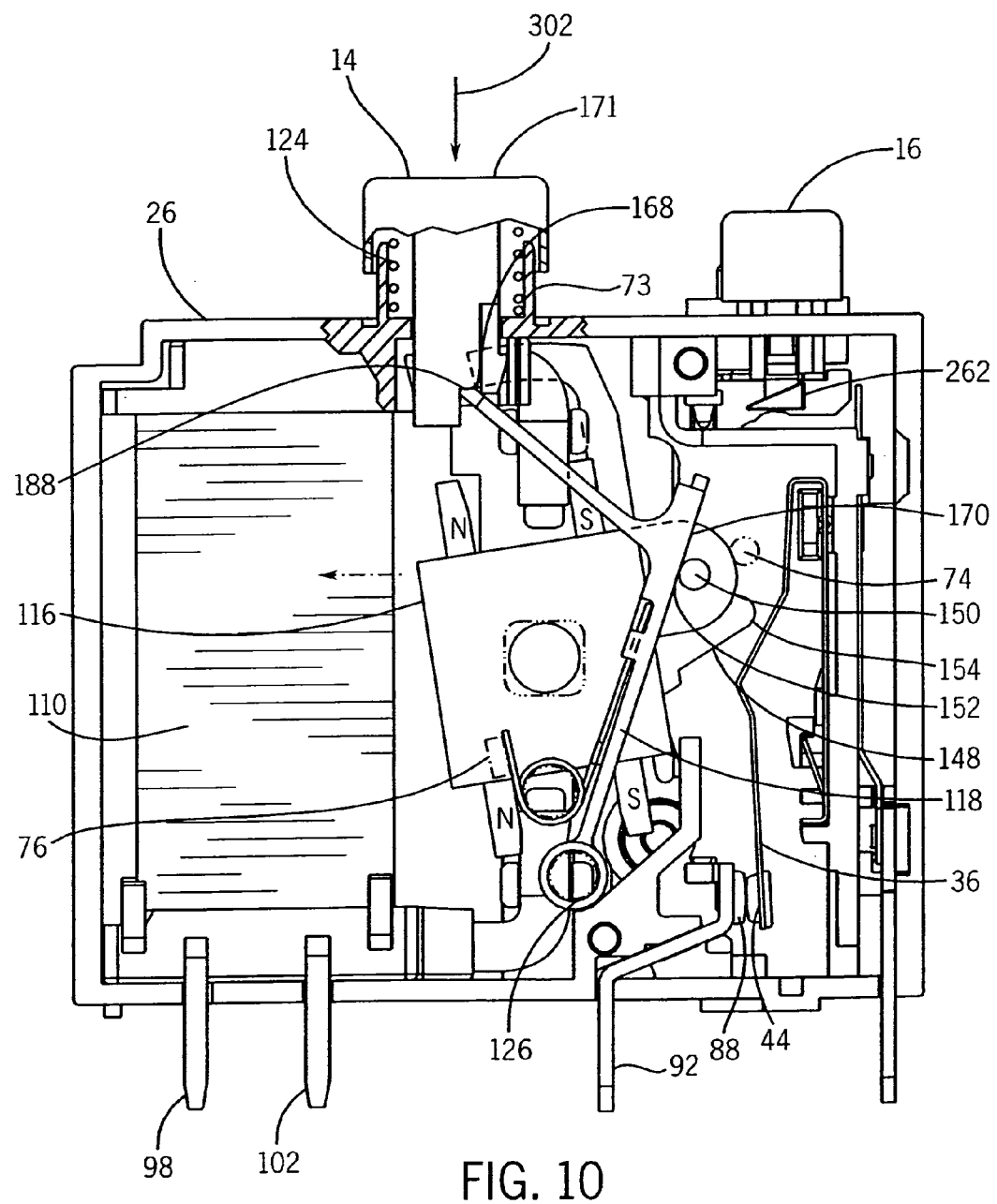
FIG. 10 is similar to FIG. 9, albeit illustrating a beginning stroke of the reset operator push button.
Figure 11:
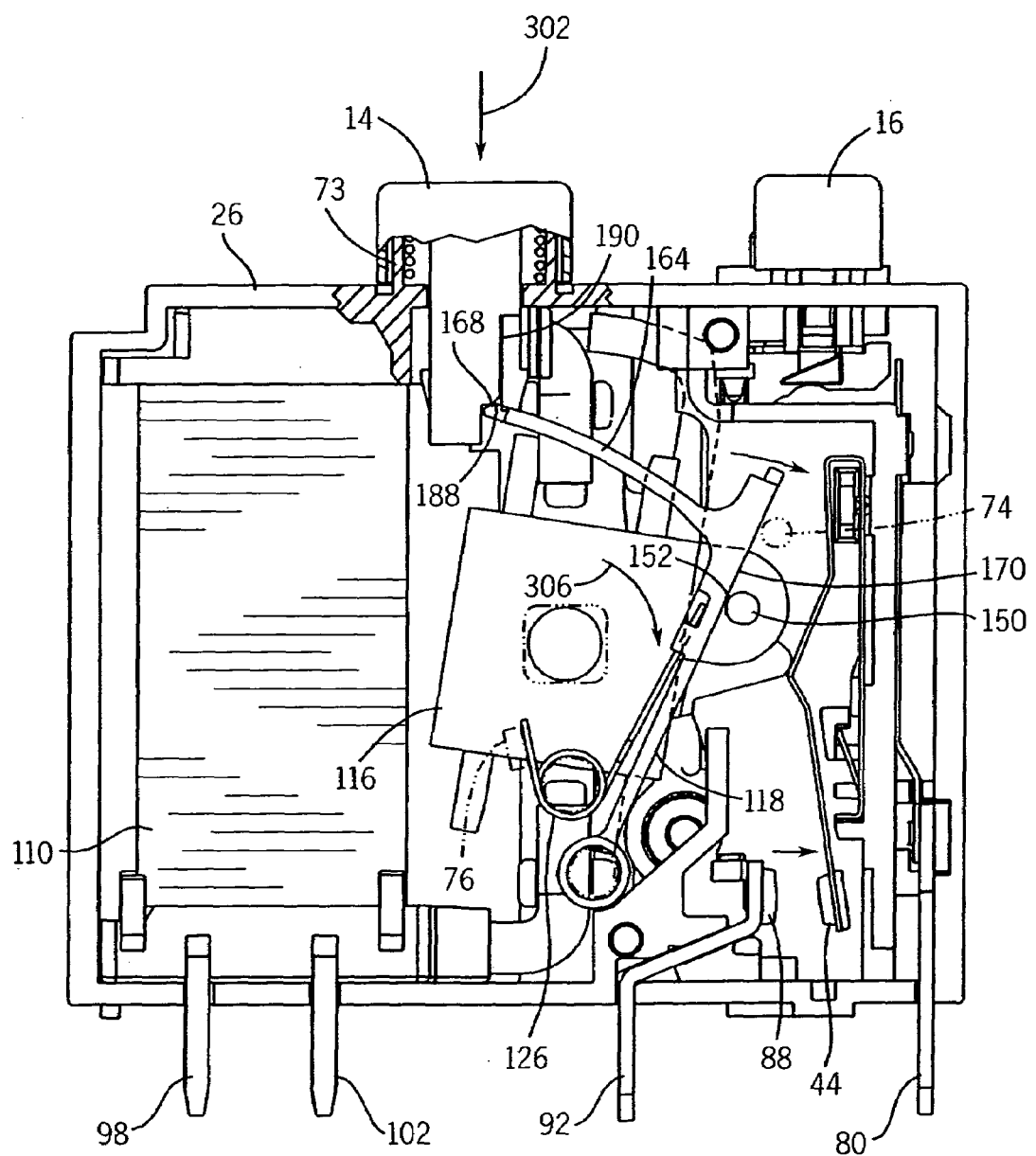
FIG. 11 is similar to FIG. 10, albeit illustrating an intermediate portion of the stroke of the reset operator push button and the relay components moving toward the first position.

Referring now to FIG. 10, to reset relay 10, button 14 is pressed along the activation axis indicated by arrow 302. when so activated, after a partial stroke, bearing surface 188 contacts distal end 168. At this point push surface 170 also contacts the first bearing surface 152 formed by post 150. Referring to FIG. 11, further pushing action on button 14 places pressure on distal end 168 which is translated through second leg member 164 to push surface 170 and thereby to first bearing surface 152 causing armature 116 to begin to rotate clockwise as indicated by arrow 306.

After armature 116 has reached a position where armature 116 will assume the first or set position and prior to the end of the stroke of button 14, second leg member 164 distorts (e.g., bends or flexes) to the point where distal end 168 flips off surface 188 and rests on limiting surface 190. Once distal end 168 rests on surface 190, armature 116 may be re-tripped if over-current or other circumstances warrant, even if button 14 is held down continuously. To this end, when button 14 is held down continuously, distal end 168 rests on and slides along surface 190 irrespective of whether or not the assembly is tripped or set, hence the assembly is a "trip-free" assembly. It should be understood that even if button 14 is only part way along its stroke, push arm 118 may be configured so that current provided to trip pin 98 would rotate armature into the tripped position (i.e., the FIGS. 9 and 13 position) despite partial activation.

Referring now to FIGS. 12 and 14 where relay 10 is again shown in the set position, turn screw 18 may be used to manually trip relay 10. To manually trip the relay 10, a screw driver may be used to rotate screw 18 one quarter turn counter-clockwise as illustrated by the arrows 308 and 310 in FIGS. 15 and 16. When screw 18 is so rotated, cam member 206 is rotated and cam surface 208 pushes on surface 226 of intermediate trip member 112. When pushed, surface 228 of member 112 in turn pushes on trip surface 213 thereby causing clockwise rotation of armature 116 as indicated by arrow 312. Eventually, armature 116 reaches its tripped stable position. When screw 16 is released, spring 120 rotates screw 18 back to its original position and member 112 relaxes and assumes its original form (see again FIG. 13).

Figure 18:
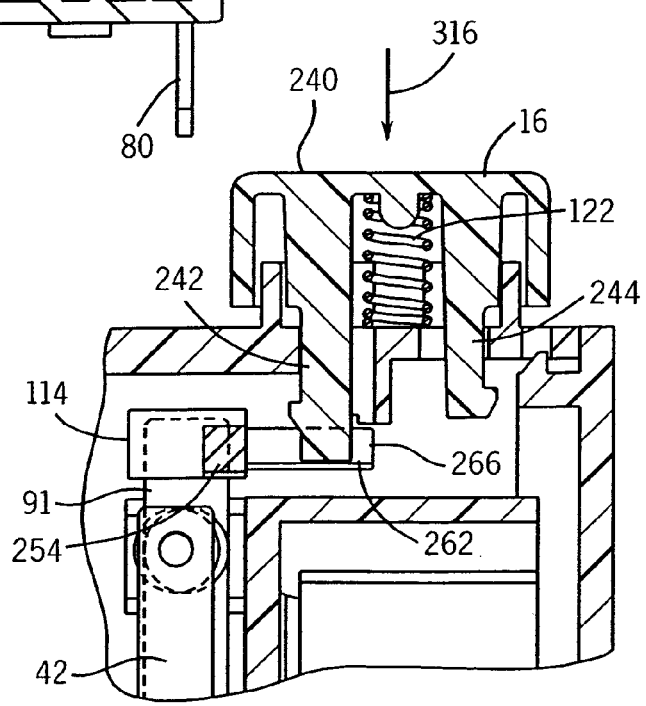
FIG. 18 is a cross-sectional view taken along the line 18—18 in FIG. 17.
Figure 19:
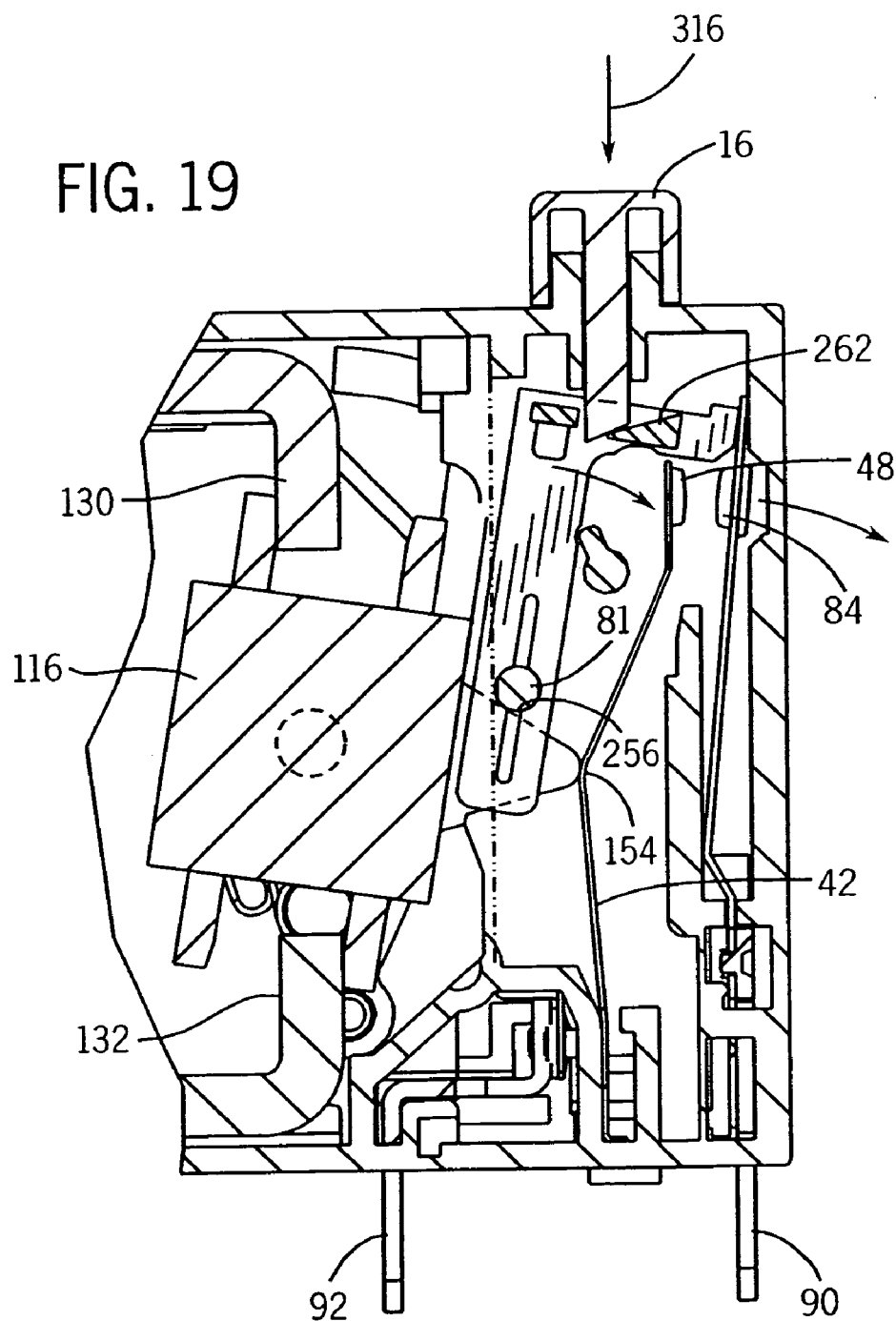
FIG. 19 is similar to FIG. 17, albeit illustrating the open circuit operator push button in a pressed position.

Referring now to FIGS. 17 through 19, with relay 10 in the set state or position (i.e., contacts 48 and 50 are closed with contacts 84 and 86, respectively), normally closed contact 84 can be momentarily separated from contact 48 by pressing button 16. When button 16 is pressed downward in the direction indicated by arrow 316, inclined surface 250 slides along wedge surface 266 and forces intermediate member 114 to rotate about post 256. After only a short rotation, end surface 260 contacts distal end 258 of contact member 91. Further rotation of member 114 causes the desired separation of normally closed contacts. When button 16 is released, spring 122 forces button 16 into its original position, member 114 springs back to is original position and contact 84 again closes against contact 48.

Referring again to FIGS. 1 and 2, it should be appreciated that in at least some embodiments, a relatively simple relay design has been described that includes components providing many desirable features where all of the components reside in a single compact housing. Also, it should be appreciated that the design includes electrical contacts that are suitable for linking to a PCB or the like. Although not necessary in all embodiments, in at least some of the embodiments all electrical pins extend from the same side of the housing to facilitate easy PCB linkage. Moreover, in at least some embodiments all of the reset, trip and open circuit operators are provided on one side of the housing to enable easy access. In this case, only one side of the housing needs to be clear of other PCB mounted components.

In at least some embodiments the operators are provided on a top surface of the housing while the electrical pins extend from a bottom to further facilitate easy linkage and easy operator access. Here, the relay housing may be mounted to a PCB such that a flat surface from which the pins extend rests on a flat mounting surface formed by the PCB when the pins are linked to PCB traces. In this case most stress from operating the operators is transferred to the PCB through the contacting surfaces and minimal stress is absorbed by the pin contacts. Moreover, in some embodiments the trip flag window (e.g., 64 in FIG. 3) is provided in a surface opposite the surface from which connecting electrical pins extend and may be provided on the same housing side as the operators.

Figure 20:
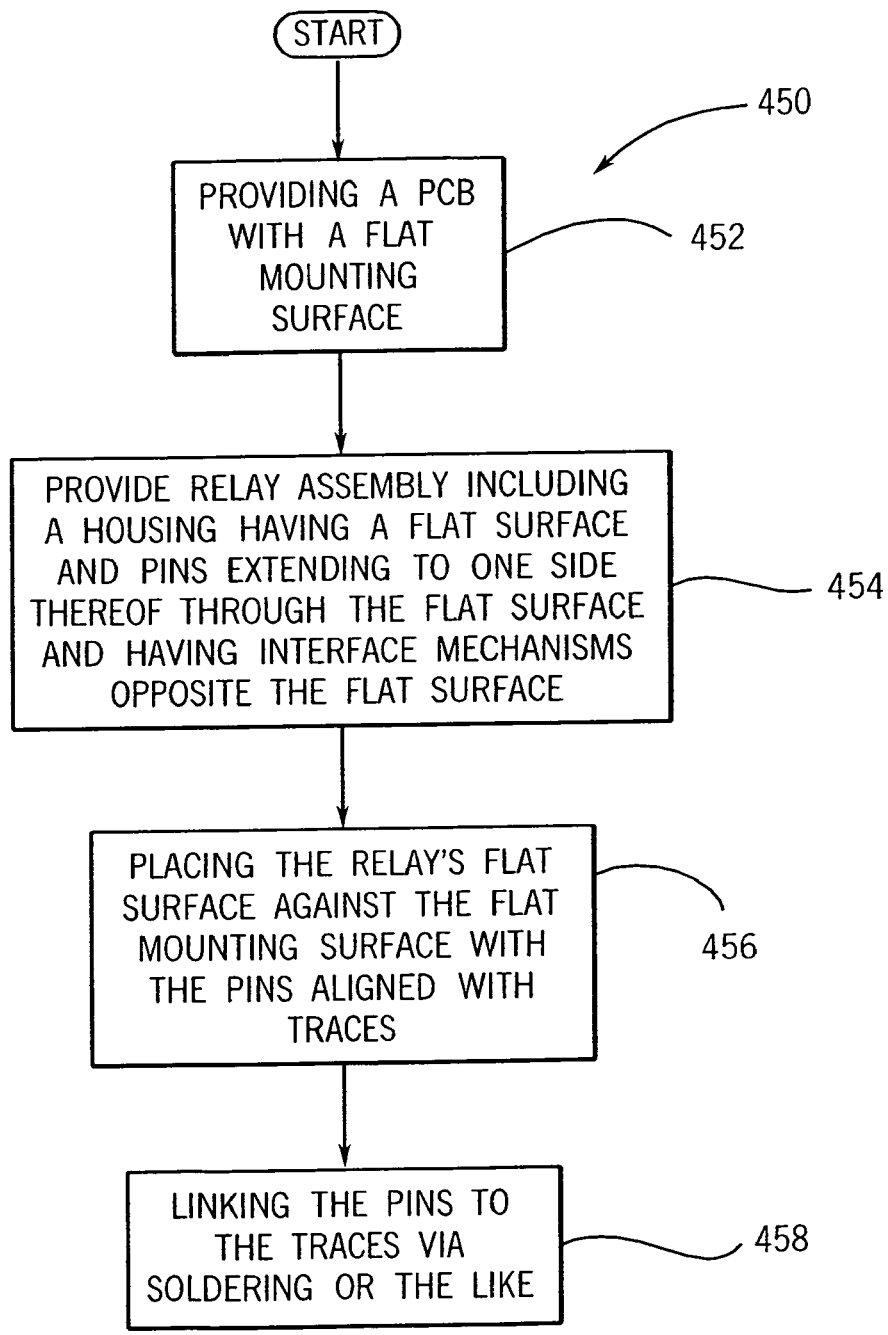
FIG. 20 is one method according to the present invention.

The invention also includes methods for configuring a relay and for configuring a relay and PCB assembly. To this end, according to one method 450 illustrated in FIG. 20, at block 452, a PCB with a flat mounting surface as illustrated in FIG. 9 is provided. Next, at block 454, a relay assembly including a housing having a flat surface and pins extending to one side thereof through the flat surface and having interface mechanisms opposite the flat surface is provided. Next, block 456, the flat surface of the relay is placed against the flat mounting surface of the PCB with the pins aligned with the electrical traces formed on the PCB. In this case, the alignment may be via apertures as in FIG. 9 or, in the alternative, may be simply a mechanical alignment. At block 458, the pins are linked via soldering or the like to the traces.

Figure 23:
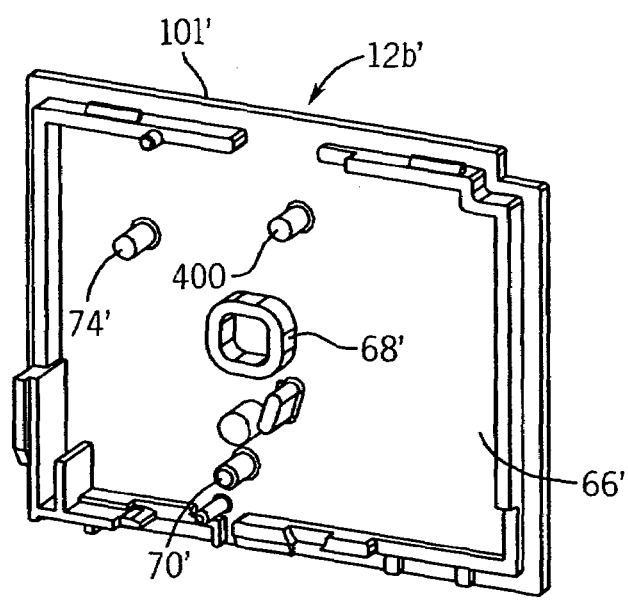
FIG. 23 is a perspective view of an additional embodiment of a second housing member.

Referring to FIG. 23, according to at least some embodiments an additional post 400 is added to a modified second housing member 12b' which extends in the same direction from surface 66' as the other structure (e.g., 74', 70', etc.) described above and which resides generally above member 68' and between member 68' and edge 101'. Other member 12b' structure is essentially identical to the structure described above with respect to FIG. 5 and therefore is not again described here in detail. Referring also and again to FIG. 8, post 400 juxtaposition with respect to push arm 118 when the assembly is constructed.

Figure 21:
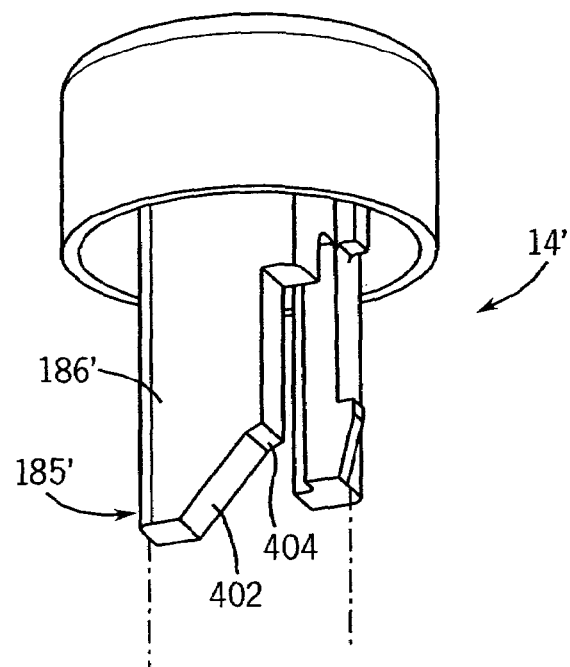
FIG. 21 is a perspective view of a reset operator button according to another embodiment of the invention, this perspective view similar to the view of FIG. 4.

Referring also to FIG. 21, a modified button member 14' that may be employed with the modified second housing member in at least some inventive embodiments is illustrated. Member 14' is similar to member 14 described above with respect to FIG. 4 except that extension member 186' replaces member 186. Member 186' includes first and second sloped surfaces 402 and 404, respectively, that bear against the distal end 168 of a push arm 118' when the assembly is in the tripped position and button member 14' is pressed.

Figure 22A:
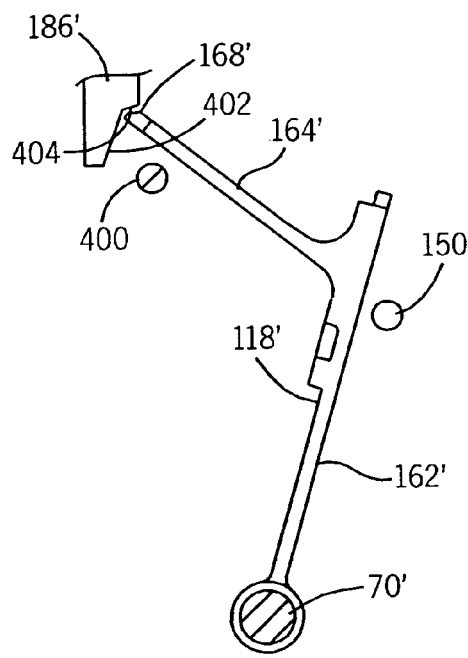
FIG. 22a is a schematic diagram illustrating partial assembly operation of an assembly including components like those illustrated in FIGS. 23 and 21.
Figure 22B:
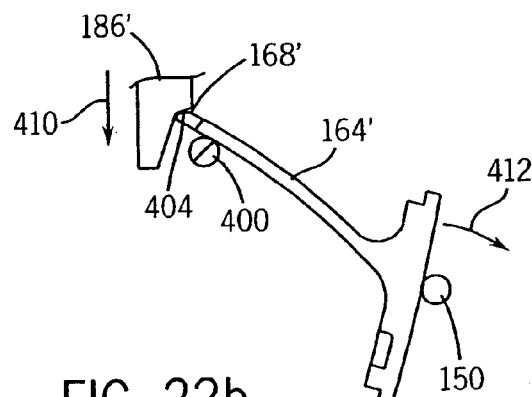
FIG. 22b is similar to FIG. 22a, albeit illustrating the components in a different operational state.
Figure 22C:
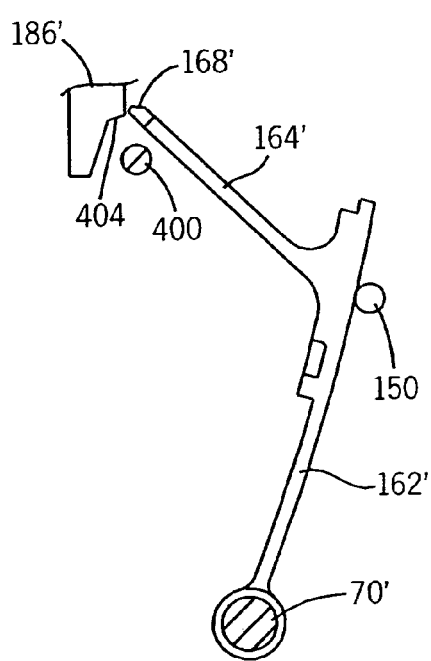
FIG. 22c is similar to FIG. 22a, albeit illustrating the components in yet another operational state.

Referring now to FIGS. 22a–22c the lower end of member 186' is illustrated along with post members 70' and 400 (see also FIG. 20) that extend from surface 66', post member 150 that extends from member 146 (not illustrated in FIGS. 22a–22c, see FIG. 8) and push arm 118' that includes members 162' and 164'. The distal end of member 162' is journaled for pivotal rotation about post 70' and so that distal end 168' is below and separated from surfaces 402 and 404 as illustrated in FIG. 22a when the assembly is in the untripped condition and button 14' is not pressed. At this point member 118' is also separate from post 150.

Referring to FIGS. 21 and 22b, when button 14' is pressed, member 186' moves along the direction indicated by arrow 410, end 168' becomes lodged in the corner formed by surfaces 402 and 404, members 164' and 162' bend as illustrated and the outside surface 170' of member 118' contacts post 150. Further movement along direction 410 causes the armature 138 (see again FIG. 10) to rotate as described above and indicated by arrow 412 and the lower surface of member 164' contacts post 400 post 400 restricts further downward movement of member 164'.

Referring to FIG. 22c, upon further movement along direction 410, post 400 causes distal end 168' to snap off surface 402 as illustrated. Thus, post 400 ensures a trip free action.

It should be understood that the methods and apparatuses described above are only exemplary and do not limit the scope of the invention, and that various modifications could be made by those skilled in the art that would fall under the scope of the invention. For instance, while one direct way of linking a pin to a PCB trace includes soldering other direct linking methods are contemplated.

To apprise the public of the scope of this invention, the following claims are made:

What is claimed is:

1. An assembly for use with a printed circuit board (PCB), the assembly comprising:
    a relay assembly including a relay housing and a trip free reset assembly mounted within the housing and linked to other relay components mounted within the housing for manually resetting the relay after the relay is tripped; and
    at least one pin linked to at least one of the relay components and including a distal end extending from the housing and suitable for direct connection to the PCB.

2. The assembly of claim 1 further including a manual trip assembly mounted within the housing and linked to other relay components for manually tripping the relay when the relay is set.

3. The assembly of claim 2 wherein the relay includes at least one normally closed contact and a manual open circuit member assembly mounted within the housing to other relay components for manually momentarily opening the at least one normally closed contact.

4. The assembly of claim 3 wherein the reset assembly, the trip assembly and the open circuit assembly include reset, trip and open circuit members for activating the assemblies, respectively, and, wherein each of the reset member, the trip member and the open circuit member are provided within the first wall member.

5. The assembly of claim 4 wherein the housing further includes at least a second wall member opposite the first wall member and wherein the at least one pin extends from the second wall member.

6. The assembly of claim 5 wherein the at least one pin includes a plurality of pins and wherein each of the pins extends from the second wall member in substantially the same direction.

7. The assembly of claim 6 for use with a PCB that forms PCB traces having a specific pattern wherein the at least one pin includes at least two pins and wherein the at least two pins are juxtaposed so as to be directly linkable to at least two suitable PCB traces.

8. The assembly of claim 6 for use with a PCB that forms a plurality of apertures and wherein the at least one pin includes at least two pins and the at least two pins are juxtaposed so as to be receivable within at least two of the apertures.

9. The assembly of claim 5 for use with a PCB that forms a substantially flat mounting surface and wherein at least a portion of the second wall member defines a substantially flat housing plane wherein the housing plane abuts the mounting surface when the assembly is mounted to the PCB and, wherein, the reset member moves along an activation axis that is substantially perpendicular to the housing plane when activated.

10. The assembly of claim 1 wherein the reset assembly includes a reset member for activating the reset assembly and wherein the reset member moves along an activation axis when activated, the at least one pin includes a distal end and wherein, the distal end of the at least one pin is substantially perpendicular to the activation axis.

11. The assembly of claim 10 wherein the housing member supports the at least one pin and the reset member.

12. The assembly of claim 11 wherein the housing member includes at least first and second oppositely facing wall members, the reset member provided in the first wall member, at least a portion of the second wall member forming a housing plane that is substantially perpendicular to the activation axis.

13. The assembly of claim 12 for use with a PCB that forms a substantially flat mounting surface, the distal end of the at least one pin extending past the housing plane such that when the housing plane abuts the mounting surface, the distal end is directly linkable to the PCB.

14. The assembly of claim 13 wherein the at least one pin includes a plurality of pins having distal ends that extend in the same direction and that are essentially perpendicular to the housing plane.

15. The assembly of claim 1 wherein the relay assembly is a bi-stable relay assembly.

16. A method for configuring a relay/printed circuit board (PCB) assembly, the method comprising the steps of:
    providing a PCB including electrical traces;
    providing a relay assembly including a relay housing and a trip free reset assembly mounted within the housing and linked to other relay components mounted within the housing for manually resetting the relay after the relay is tripped, the relay assembly also including at least one pin linked to at least one of the other relay components and including a distal end that extends from the housing; and
    linking the distal end directly to at least one of the electrical traces on the PCB.

17. The method of claim 16 wherein the step of providing a relay assembly includes the steps of providing a relay where the trip free reset assembly includes a reset member for activating the reset and providing the housing including at least first and second oppositely facing wall members wherein the relay member is in the first wall member and the at least one pin extends from the second wall member.

18. The method of claim 17 wherein the step of providing a PCB includes providing a PCB that forms PCB traces having a specific pattern, the step of providing a relay assembly including providing a relay having at least two pins juxtaposed so as to be directly linkable to at least two different PCB traces.

19. The method of claim 16 wherein the step of providing a relay assembly includes providing a relay assembly including at least one normally closed contact, a manual trip assembly including a manual trip member for activating the manual trip assembly, the manual trip assembly linked to other relay components for tripping the relay when the relay is set and a manual open circuit assembly including a manual open circuit member for activating the manual open circuit assembly, the manual open circuit assembly linked to other relay components for momentarily opening the at least one normally closed contact when activated.

20. The method of claim 16 wherein the step of providing a relay assembly includes providing a trip free reset assembly including a trip free reset member for activating the trip free reset wherein the reset member moves along an activation axis when activated, the at least one pin including a distal end and wherein, the distal end of the at least one pin is substantially perpendicular to the activation axis.

21. The method of claim 20 wherein the housing supports the at least one pin and the reset member.

22. The method of claim 21 wherein the housing includes at least first and second oppositely facing wall members, the reset member provided in the first wall member, at least a portion of the second wall member forming a housing plane that is substantially perpendicular to the activation axis.

23. The method of claim 22 wherein the step of providing a PCB includes providing a PCB that forms a substantially flat mounting surface, the step of providing a relay assembly including providing a relay assembly where the distal end of the at least one pin extends past the housing plane such that when the housing plane abuts the mounting surface, the distal end is directly linkable to the PCB.

24. The method of claim 16 wherein the step of providing the relay assembly includes providing a bi-stable relay assembly.

25. An assembly for use with a printed circuit board (PCB), the assembly comprising:
a relay assembly including a relay housing and a trip free reset assembly mounted within the housing and linked to other relay components mounted within the housing for manually resetting the relay after the relay is tripped, the reset assembly including a reset member selectable for activating a trip free reset, the reset member moving along an activation axis when activated; and
at least one pin linked to at least one of the relay components and including a distal end suitable for direct connection to the PCB, the pin extending in a direction substantially parallel to the activation axis and from the housing.

26. The assembly of claim 25 wherein the housing includes at least first and second oppositely facing wall members, the reset member provided in the first wall member, at least a portion of the second wall member forming a housing plane that is substantially perpendicular to the activation axis.

27. The assembly of claim 26 for use with a PCB that forms a substantially flat mounting surface, the distal end of the at least one pin extending past the housing plane such that when the housing plane abuts the mounting surface, the distal end is directly linkable to the PCB.

28. The assembly of claim 25 wherein the relay assembly is a bi-stable relay assembly.

29. A relay-printed circuit board (PCB) assembly comprising:
a PCB including a pattern of traces;
a relay assembly including a relay housing and a trip free reset assembly mounted within the housing and linked to other relay components mounted within the housing for manually resetting the relay after the relay is tripped; and
at least one pin linked to at least one of the relay components and including a distal end extending from the housing and directly linked to at least one of the traces.

30. The assembly of claim 29 wherein the reset assembly includes a reset member for activating the reset assembly, the reset member moving along an activation axis when activated, the at least one pin including a distal end linked to the PCB and wherein, the distal end of the at least one pin is substantially perpendicular to the activation axis.

31. The assembly of claim 30 wherein the housing includes at least first and second oppositely facing wall members, the reset member provided in the first wall member, at least a portion of the second wall member forming a housing plane that is substantially perpendicular to the activation axis.

32. The assembly of claim 31 wherein the PCB forms a substantially flat mounting surface, the distal end of the at least one pin extends past the housing plane such that when the housing plane abuts the mounting surface, the distal end is directly linkable to the PCB.

33. The assembly of claim 32 wherein the at least one pin extends from the second wall member in a direction substantially perpendicular thereto.

34. The assembly of claim 29 wherein the relay assembly is a bi-stable relay assembly.

35. An assembly for use with a printed circuit board (PCB), the assembly comprising:
a relay assembly including a housing, at least one normally closed contact, a trip free reset assembly, linked to other relay components for manually resetting the relay after the relay is tripped, a manual trip assembly linked to other relay components for manually tripping the relay when the relay is set and a manual open circuit assembly linked to other relay components for manually momentarily opening the at least one normally closed contact, each of the manual trip, reset and open circuit assemblies including an interface member for activating the associated assembly, each of the at least one normally closed contact, manual trip, reset and open circuit assemblies mounted within the housing; and
at least one pin linked to at least one of the relay components and including a distal end suitable for direct connection to the PCB.

36. The assembly of claim 35 wherein the relay assembly is a bi-stable relay assembly.

* * * * *